(12) United States Patent
Takeda et al.

(10) Patent No.: US 10,289,480 B2
(45) Date of Patent: May 14, 2019

(54) MEMORY SYSTEM

(71) Applicant: TOSHIBA MEMORY CORPORATION, Minato-ku (JP)

(72) Inventors: Naomi Takeda, Yokohama (JP); Tokumasa Hara, Kawasaki (JP); Masanobu Shirakawa, Chigasaki (JP); Hiroshi Yao, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 133 days.

(21) Appl. No.: 14/847,083

(22) Filed: Sep. 8, 2015

(65) Prior Publication Data

US 2016/0266955 A1 Sep. 15, 2016

Related U.S. Application Data

(60) Provisional application No. 62/132,244, filed on Mar. 12, 2015.

(51) Int. Cl.
| | |
|---|---|
| *G06F 11/00* | (2006.01) |
| *G06F 11/08* | (2006.01) |
| *G06F 12/00* | (2006.01) |
| *G11C 29/00* | (2006.01) |
| *G11C 29/44* | (2006.01) |
| *G11C 16/04* | (2006.01) |

(52) U.S. Cl.
CPC .............. *G06F 11/08* (2013.01); *G06F 12/00* (2013.01); *G11C 29/00* (2013.01); *G11C 29/44* (2013.01); *G11C 29/70* (2013.01); *G11C 16/0483* (2013.01); *G11C 2029/4402* (2013.01)

(58) Field of Classification Search
CPC ............ G11C 11/5628; G11C 11/5621; G11C 16/0483; G11C 16/16; G11C 16/349; G11C 16/765; G11C 16/04; G11C 16/06; G11C 16/08; G06F 12/0669
See application file for complete search history.

(56) References Cited

U.S. PATENT DOCUMENTS

| | | | | |
|---|---|---|---|---|
| 5,860,080 | A * | 1/1999 | James | ................. G06F 12/0669 370/390 |
| 6,381,174 | B1 * | 4/2002 | Roohparvar | ............. G11C 8/12 365/185.09 |
| 7,177,191 | B2 * | 2/2007 | Fasoli | ............... H01L 27/11551 257/E27.103 |

(Continued)

FOREIGN PATENT DOCUMENTS

| | | |
|---|---|---|
| JP | 2012-146369 | 8/2012 |
| JP | 2014-63551 | 4/2014 |

(Continued)

*Primary Examiner* — Bryce P Bonzo
*Assistant Examiner* — Jeison C Arcos
(74) *Attorney, Agent, or Firm* — Oblon, McClelland, Maier & Neustadt, L.L.P.

(57) ABSTRACT

A memory system includes a memory and a controller. The memory includes a first memory chip and a second memory chip. The controller controls the memory. Each of the first and second memory chips includes string units and blocks including the string units. The memory holds information indicating a partial bad block including a bad string unit, and indicating which one of string units is the bad string unit in the partial bad block.

20 Claims, 39 Drawing Sheets

(56) References Cited

U.S. PATENT DOCUMENTS

| | | | |
|---|---|---|---|
| 8,966,330 B1* | 2/2015 | Raghu | G11C 16/10 714/721 |
| 2002/0085419 A1* | 7/2002 | Kwon | G11C 16/08 365/185.17 |
| 2005/0111259 A1* | 5/2005 | Fukuda | G11C 16/16 365/185.11 |
| 2005/0169057 A1* | 8/2005 | Shibata | G11C 11/5628 365/185.28 |
| 2006/0064537 A1* | 3/2006 | Oshima | G06F 3/0614 711/103 |
| 2006/0146608 A1* | 7/2006 | Fasoli | G11C 16/0483 365/185.17 |
| 2007/0201274 A1* | 8/2007 | Yu | G11C 11/5621 365/185.09 |
| 2007/0253250 A1* | 11/2007 | Shibata | G11C 11/5628 365/185.03 |
| 2008/0055989 A1* | 3/2008 | Lee | G06F 11/1068 365/185.09 |
| 2008/0127104 A1* | 5/2008 | Li | G06F 11/1072 717/126 |
| 2009/0125671 A1* | 5/2009 | Flynn | G06F 9/52 711/103 |
| 2009/0267128 A1 | 10/2009 | Maejima | |
| 2009/0268522 A1 | 10/2009 | Maejima | |
| 2010/0107004 A1* | 4/2010 | Bottelli | G11C 29/802 714/6.12 |
| 2010/0207195 A1 | 8/2010 | Fukuzumi et al. | |
| 2010/0214838 A1 | 8/2010 | Hishida et al. | |
| 2011/0284946 A1 | 11/2011 | Kiyotoshi | |
| 2012/0026775 A1* | 2/2012 | Yamada | G11C 16/0483 365/94 |
| 2012/0069663 A1 | 3/2012 | Itagaki et al. | |
| 2012/0182803 A1 | 7/2012 | Shirakawa | |
| 2012/0307557 A1 | 12/2012 | Itagaki | |
| 2013/0094294 A1* | 4/2013 | Kwak | H01L 27/1157 365/185.03 |
| 2013/0332769 A1* | 12/2013 | Parat | G11C 16/16 714/6.13 |
| 2014/0063952 A1* | 3/2014 | Hara | G11C 16/0483 365/185.11 |
| 2014/0085982 A1* | 3/2014 | Asaoka | G11C 16/06 365/185.17 |
| 2014/0086001 A1 | 3/2014 | Fukano | |
| 2015/0262699 A1* | 9/2015 | Shirakawa | G11C 16/3445 365/185.11 |
| 2016/0267003 A1* | 9/2016 | Morio | G06F 12/0246 |

FOREIGN PATENT DOCUMENTS

| | | |
|---|---|---|
| JP | 2014-63556 | 4/2014 |
| JP | 2015-174118 A | 10/2015 |
| JP | 2015-176628 A | 10/2015 |

* cited by examiner

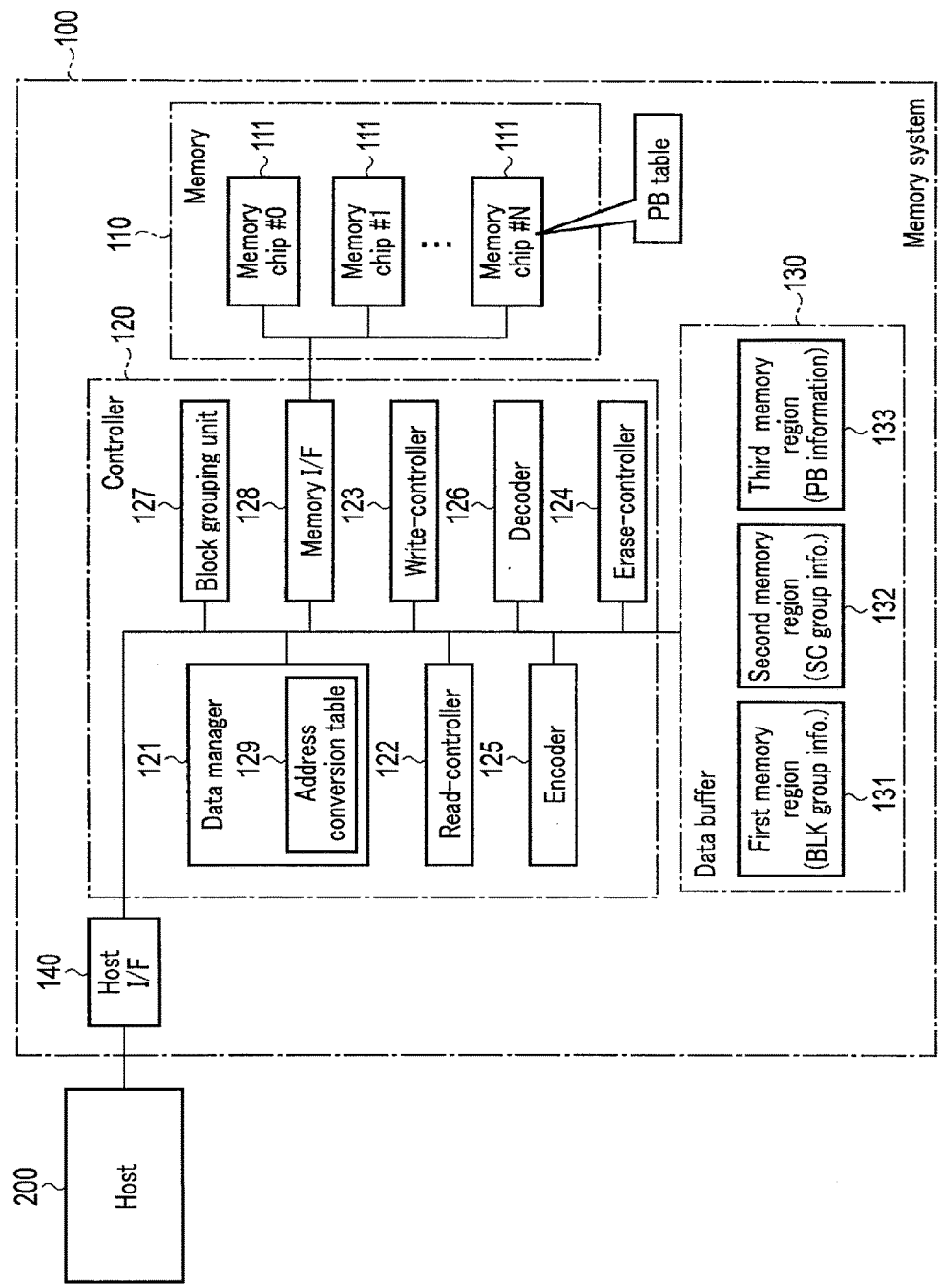
F I G. 1

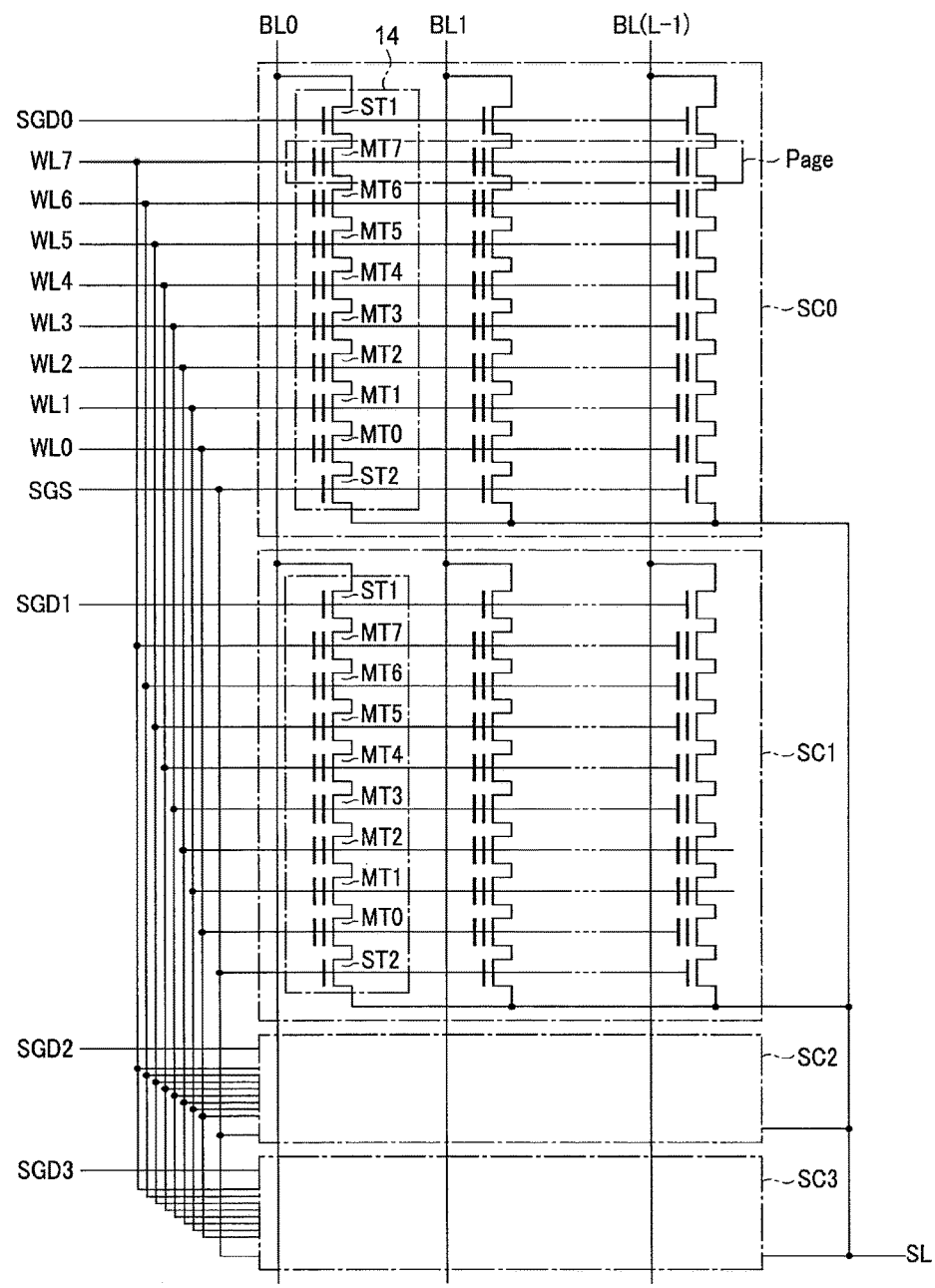
F I G. 3

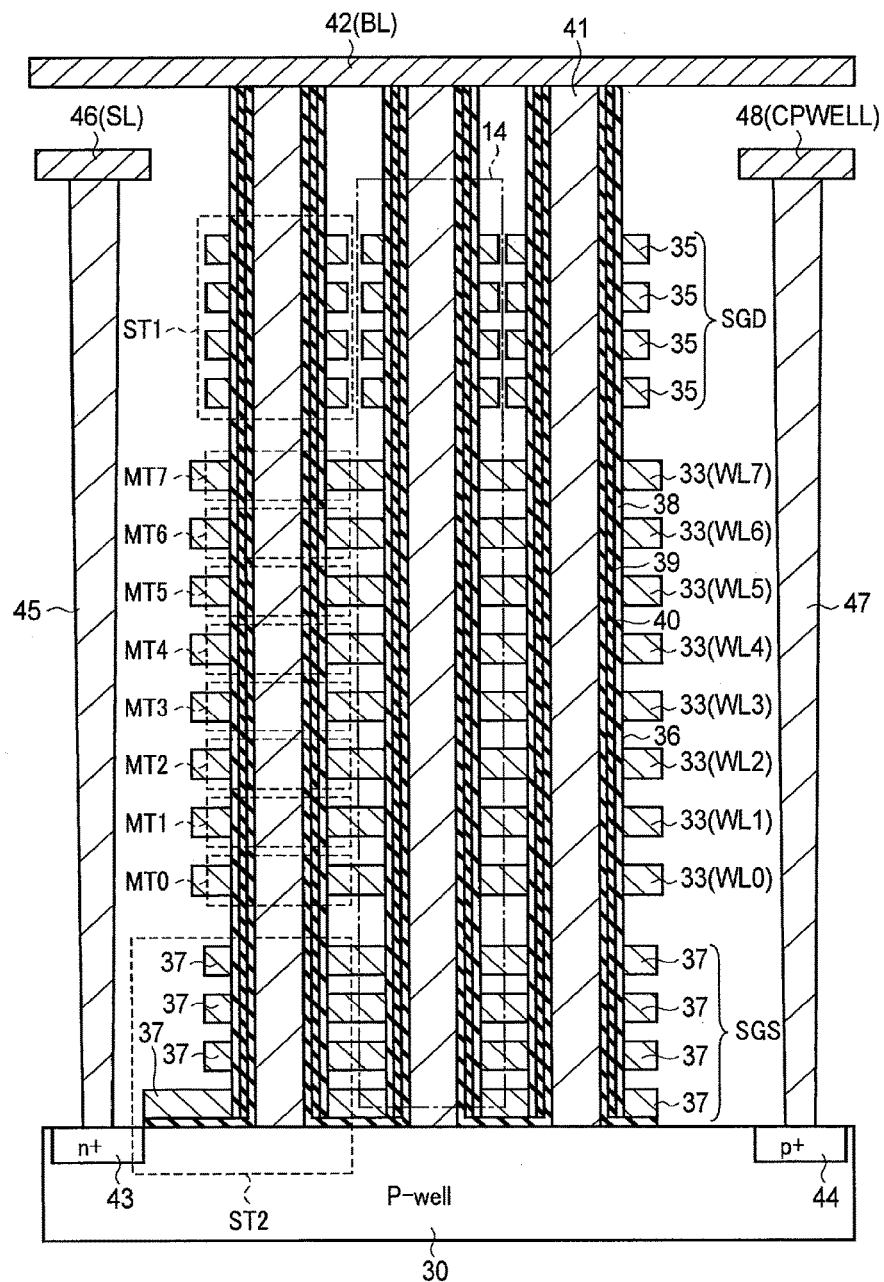
F I G. 4

1st Write CMD: Single-plane writing command
2nd Write CMD: Multiple-plane writing command

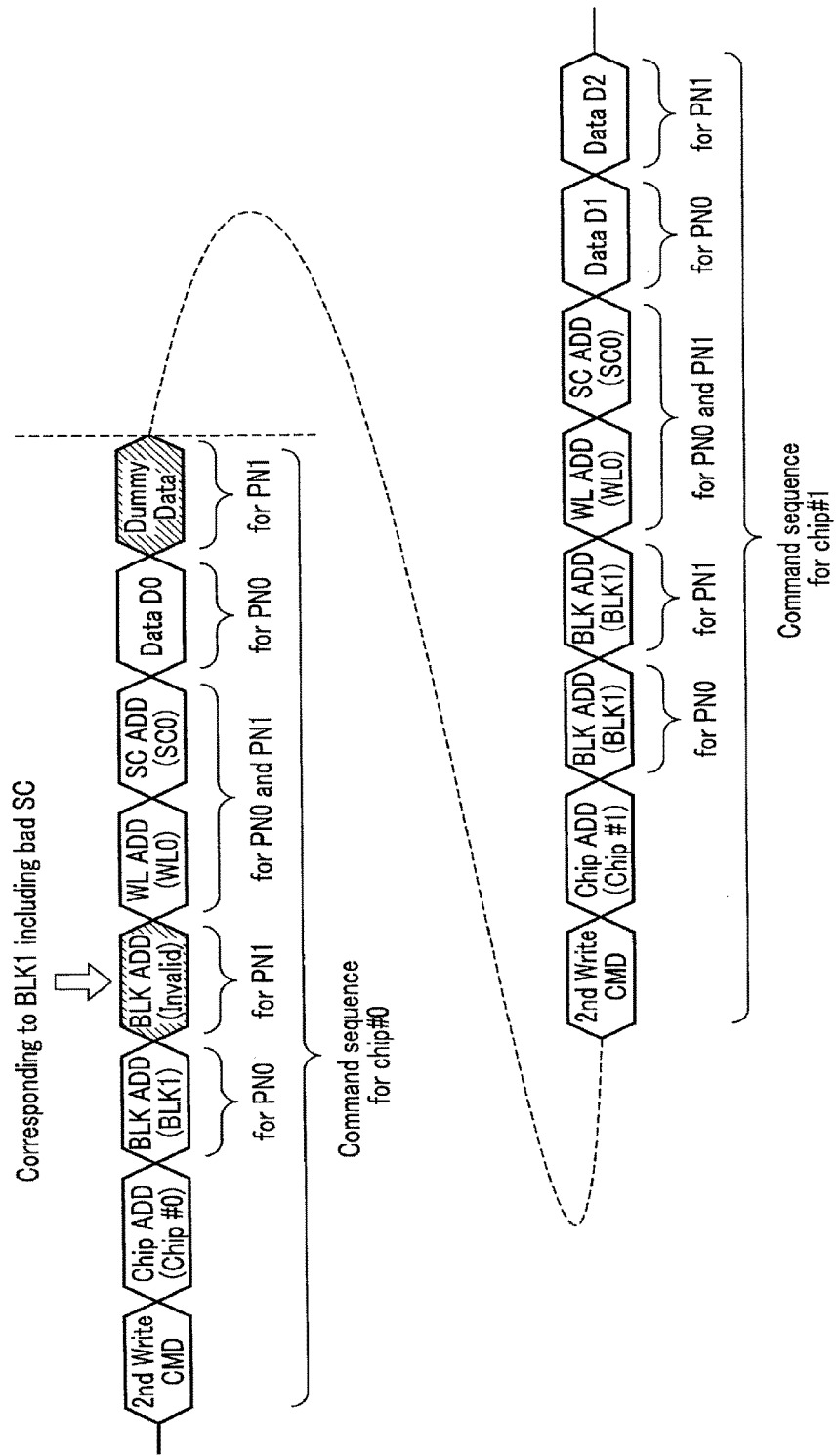
F I G. 11

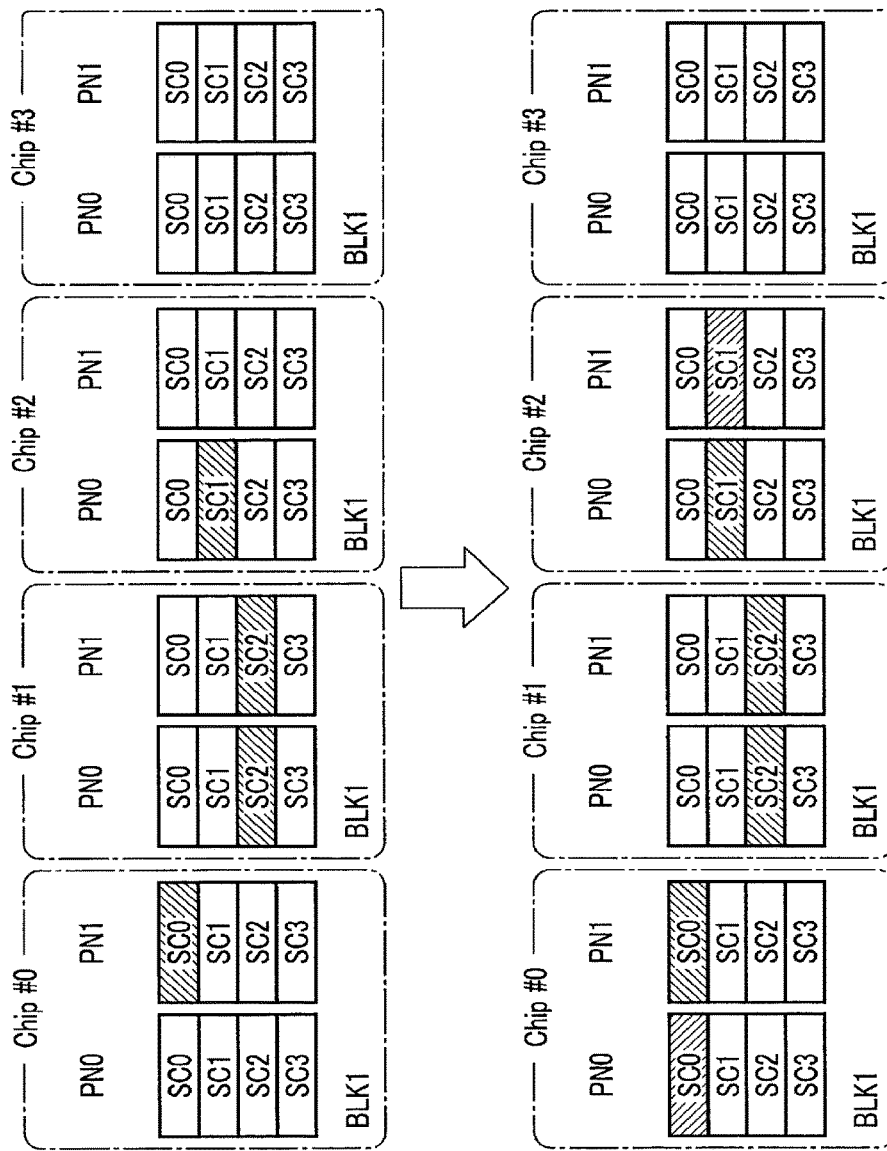
F I G. 15

| Chip #0 | Chip #1 | Chip #2 | Chip #3 |
|---|---|---|---|
| BLK1: "1000" | BLK1: "0010" | BLK1: "0100" | - |
| ⋮ | ⋮ | ⋮ | ⋮ |
F I G. 16
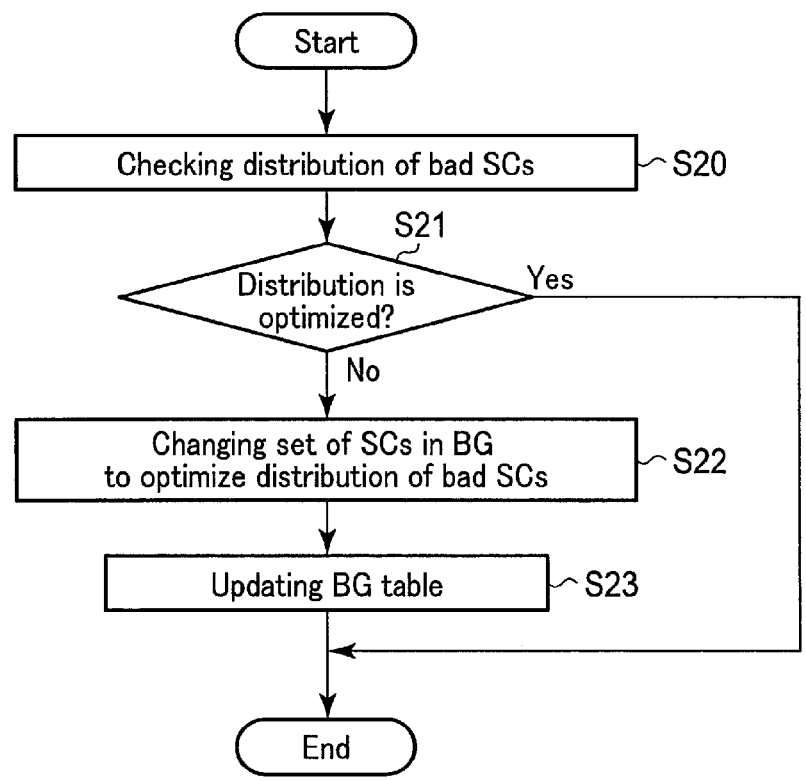
F I G. 17

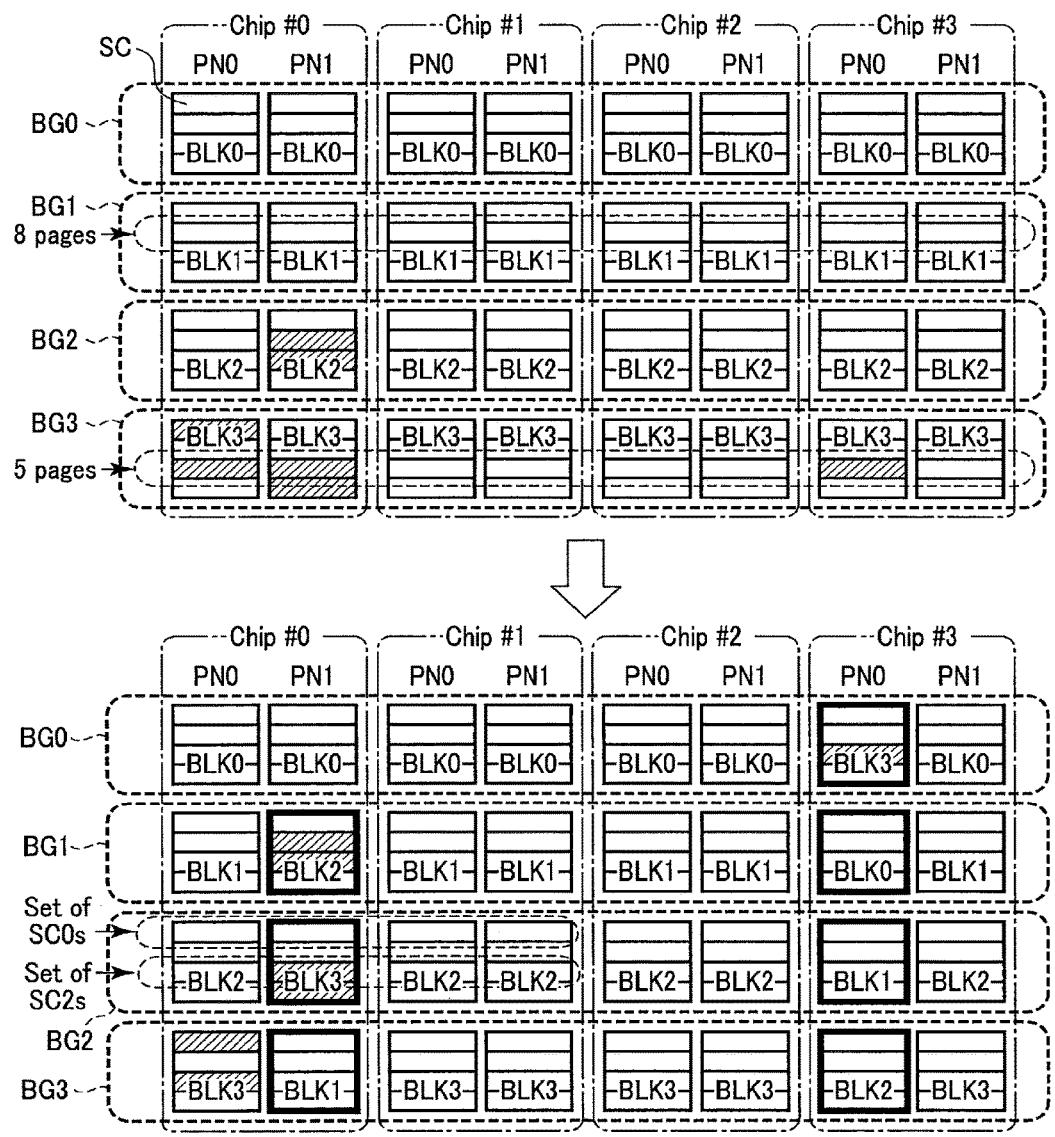
F I G. 18

|  | Chip #0 | | Chip #1 | | Chip #2 | | Chip #3 | |
|---|---|---|---|---|---|---|---|---|
|  | PN0 | PN1 | PN0 | PN1 | PN0 | PN1 | PN0 | PN1 |
| BG0 | BLK0 | BLK0 | BLK0 | BLK0 | BLK0 | BLK0 | BLK3 | BLK0 |
| BG1 | BLK1 | BLK2 | BLK1 | BLK1 | BLK1 | BLK1 | BLK0 | BLK1 |
| BG2 | BLK2 | BLK3 | BLK2 | BLK2 | BLK2 | BLK2 | BLK1 | BLK2 |
| BG3 | BLK3 | BLK1 | BLK3 | BLK3 | BLK3 | BLK3 | BLK2 | BLK3 |

F I G. 19

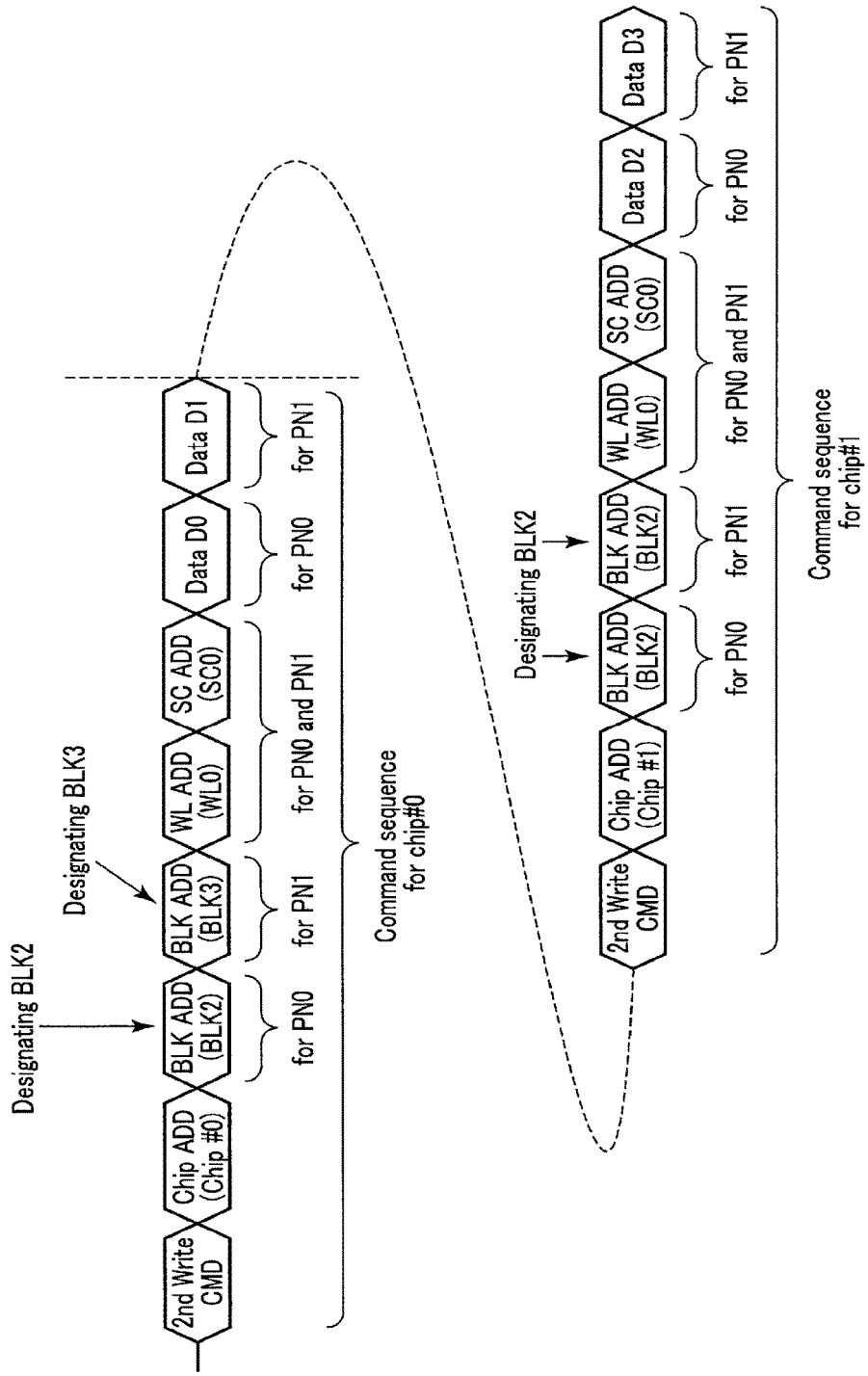
F I G. 20

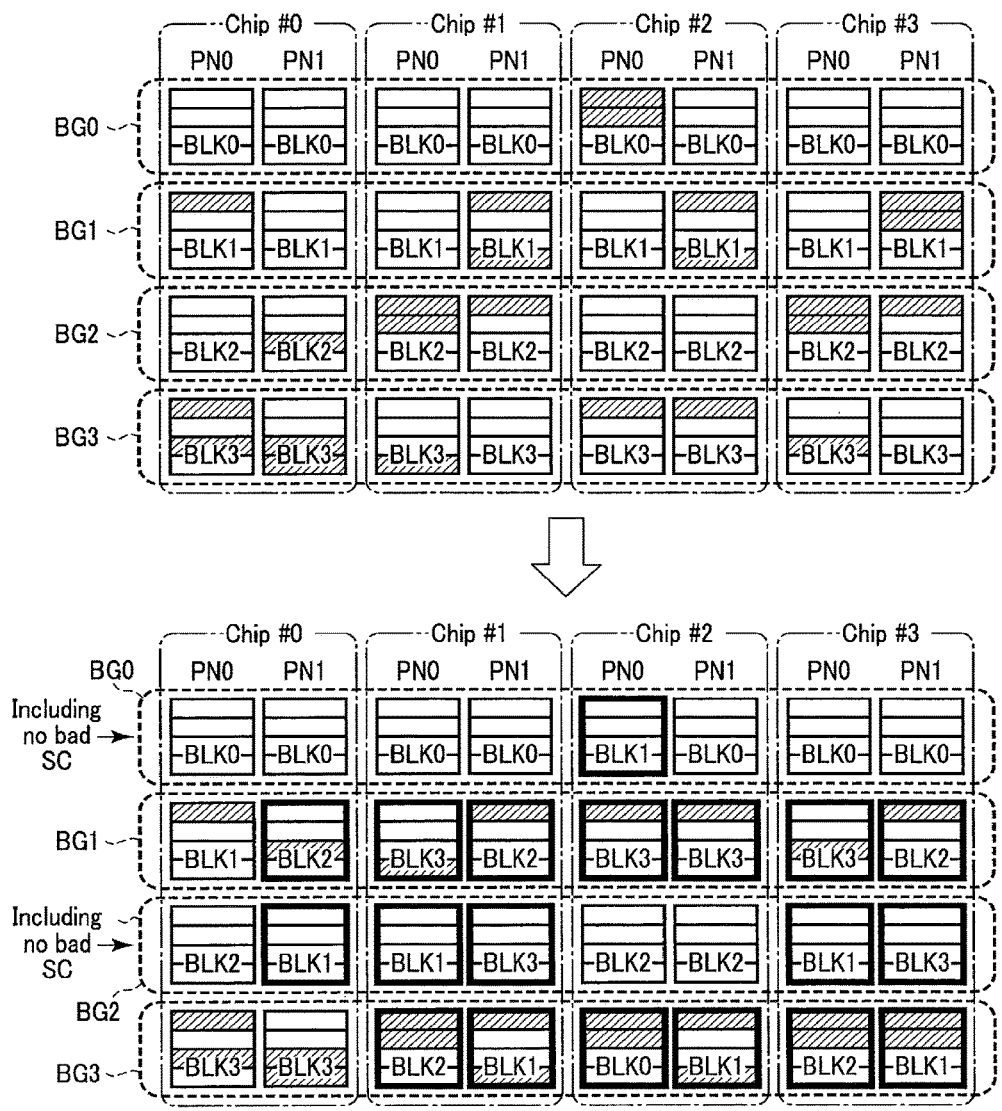
F I G. 23

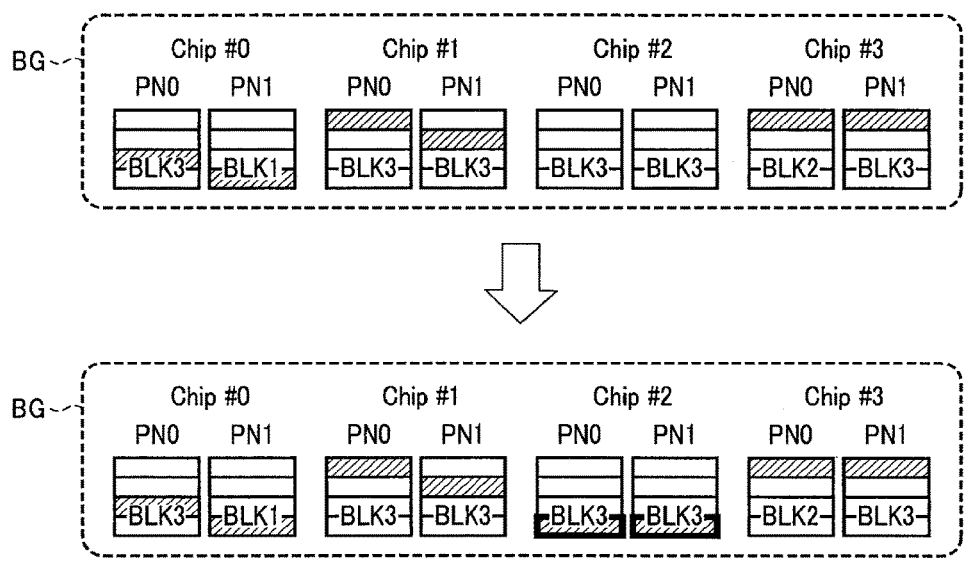
F I G. 24

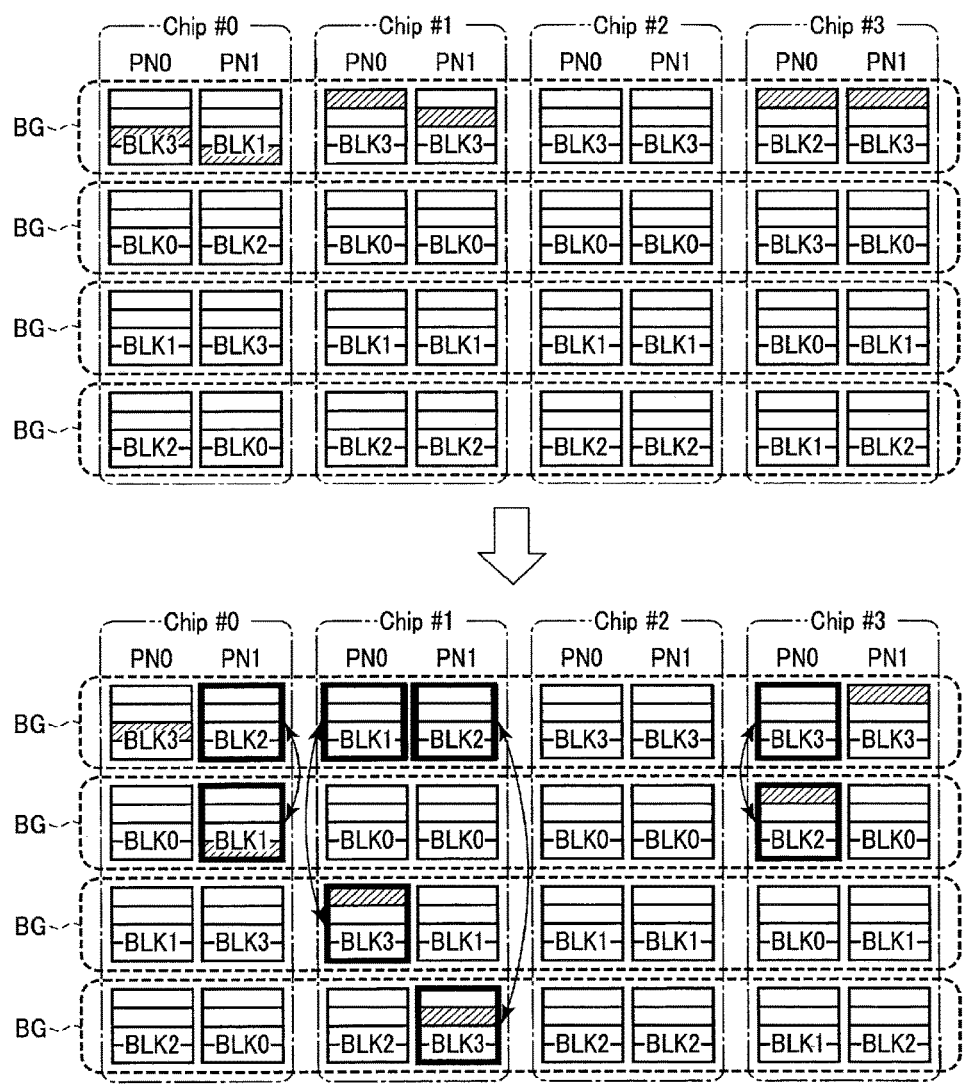
F I G. 25

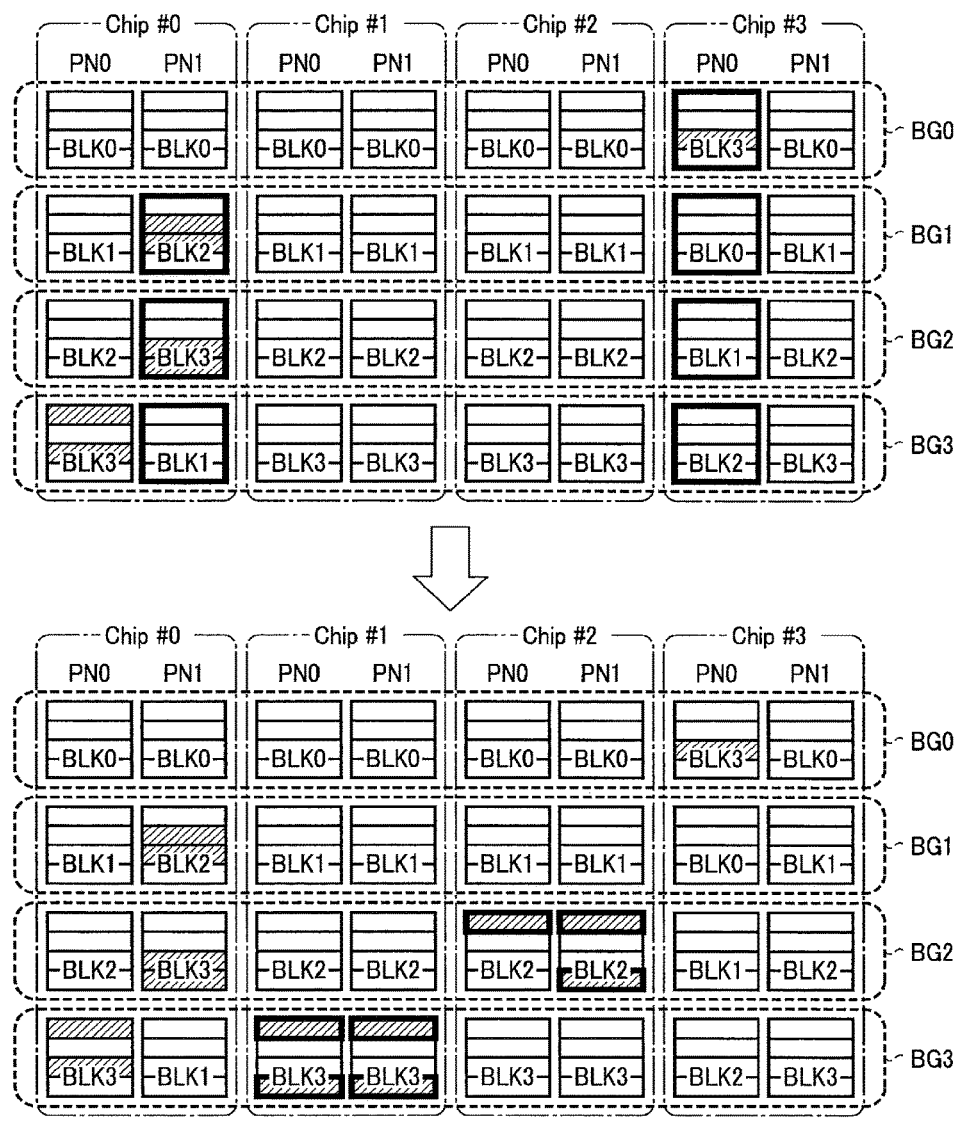
F I G. 29

| Chip #0 | | Chip #1 | | Chip #2 | | Chip #3 | |
|---|---|---|---|---|---|---|---|
| PN0 | PN1 | PN0 | PN1 | PN0 | PN1 | PN0 | PN1 |
| BLK3: "1010" | BLK2: "0110" | BLK3: "1001" | BLK3: "1001" | BLK2: "1000" | BLK2: "1001" | BLK3: "0010" | — |
| — | BLK3: "0011" | — | — | — | — | — | — |
| — | — | — | — | — | — | — | — |

F I G. 30

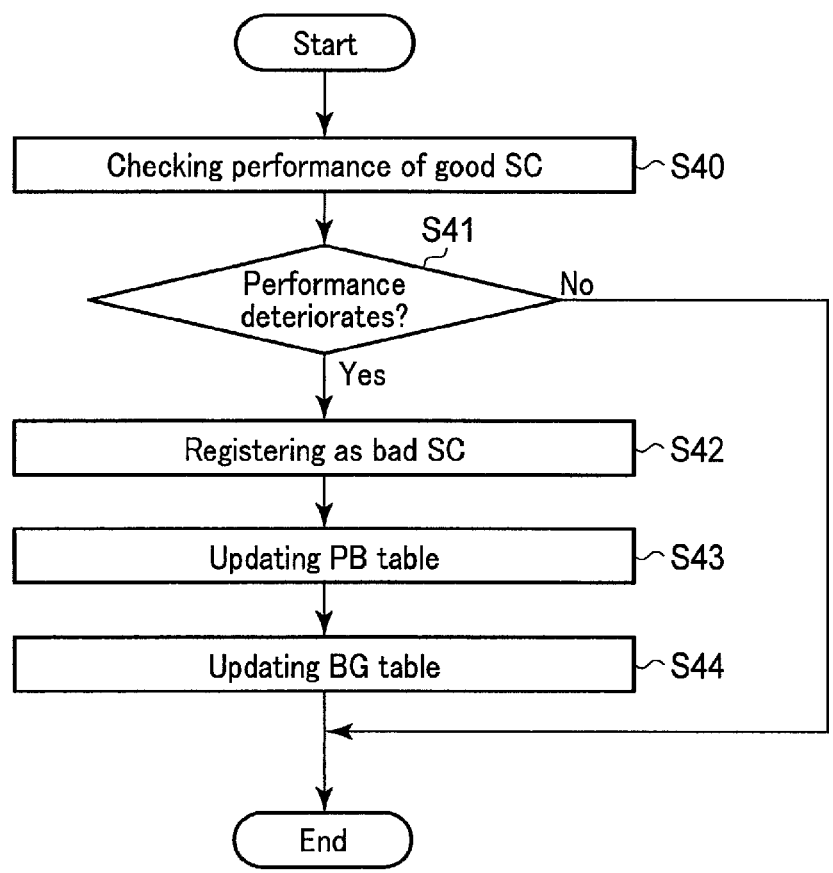
F I G. 31

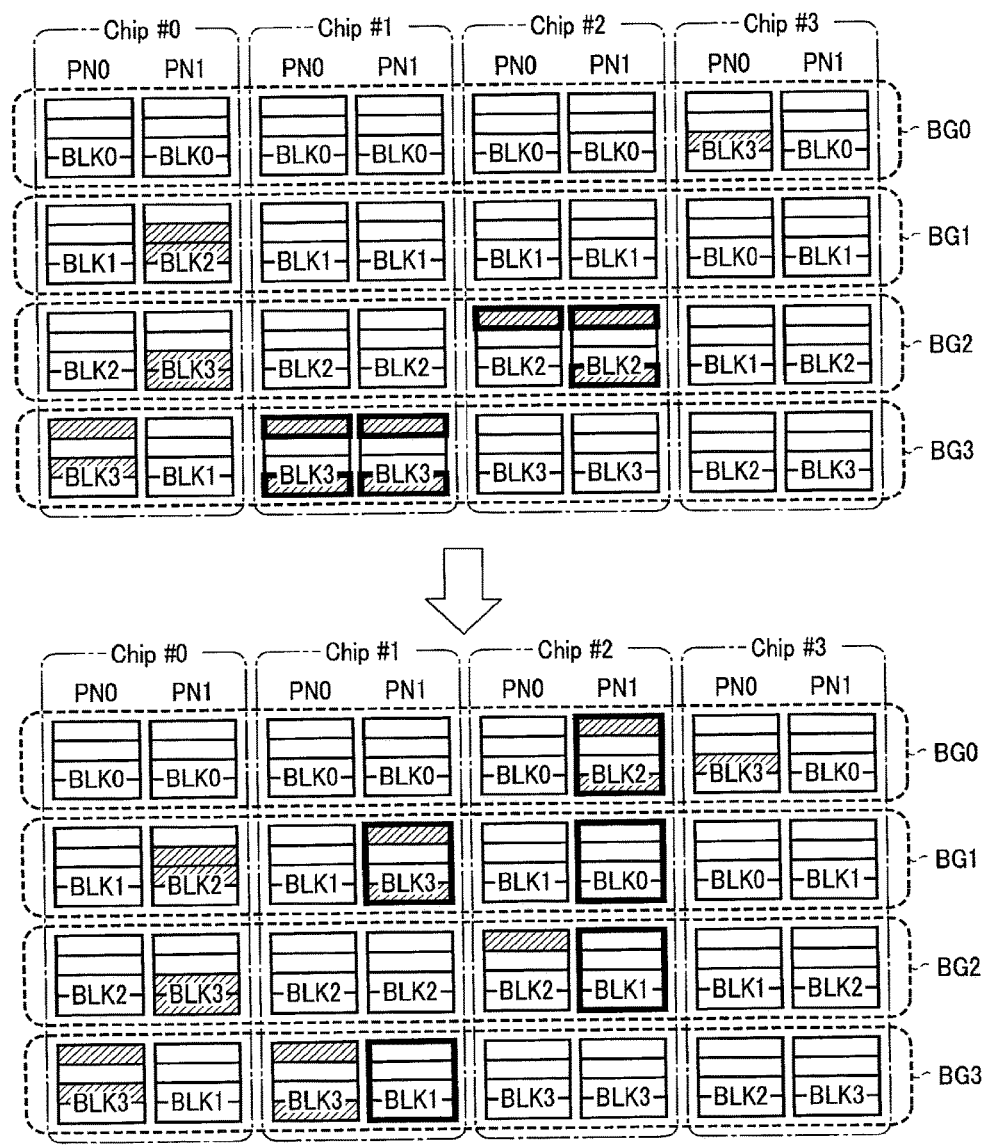
F I G. 32

|  | Chip #0 | | Chip #1 | | Chip #2 | | Chip #3 | |
|---|---|---|---|---|---|---|---|---|
|  | PN0 | PN1 | PN0 | PN1 | PN0 | PN1 | PN0 | PN1 |
| BG0 | BLK0 | BLK0 | BLK0 | BLK0 | BLK0 | BLK2 | BLK3 | BLK0 |
| BG1 | BLK1 | BLK2 | BLK1 | BLK3 | BLK1 | BLK0 | BLK0 | BLK1 |
| BG2 | BLK2 | BLK3 | BLK2 | BLK2 | BLK2 | BLK1 | BLK1 | BLK2 |
| BG3 | BLK3 | BLK1 | BLK3 | BLK1 | BLK3 | BLK3 | BLK2 | BLK3 |

F I G. 33

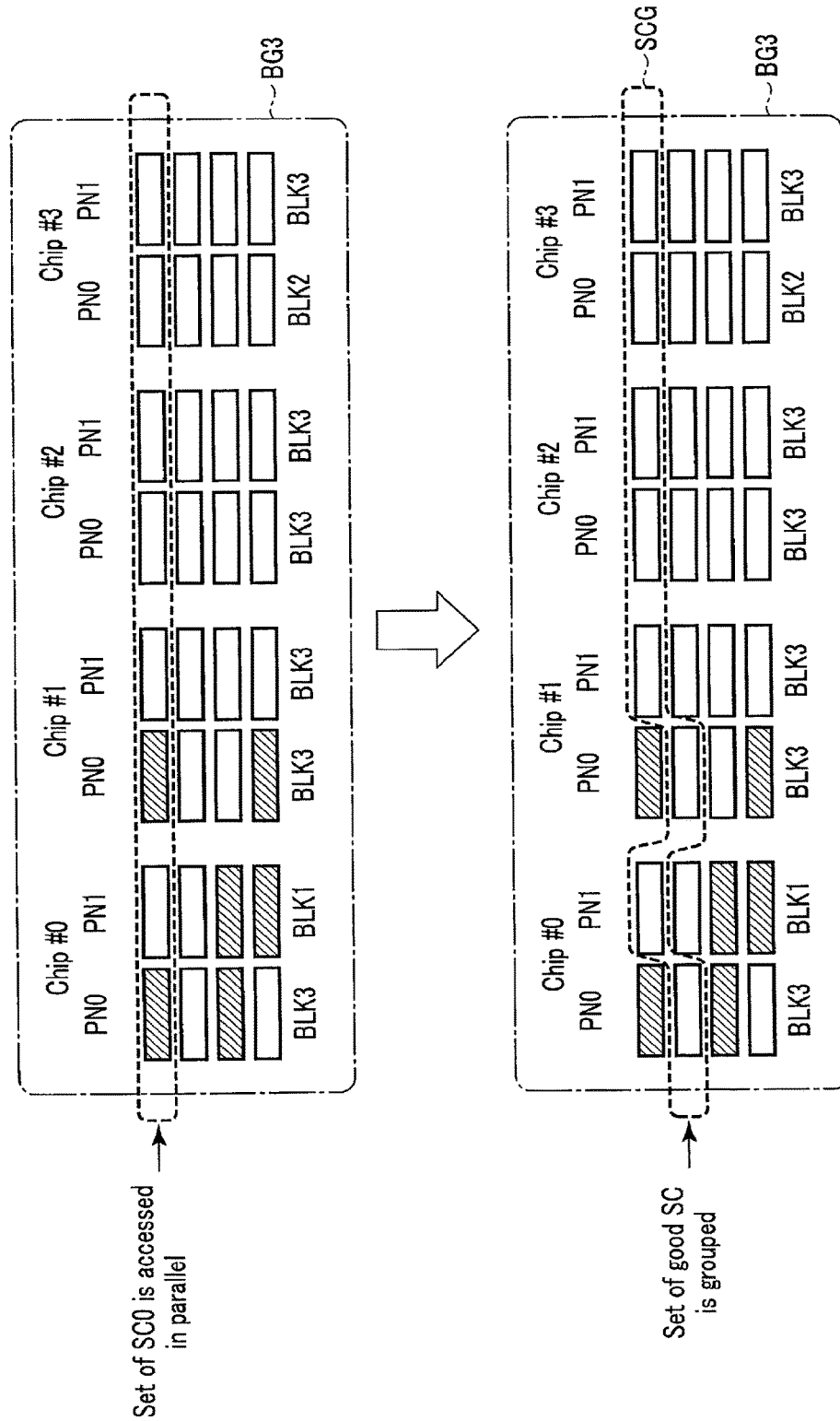
F I G. 34

|  | Chip #0 | | Chip #1 | | Chip #2 | | Chip #3 | |
|---|---|---|---|---|---|---|---|---|
|  | PN0 | PN1 | PN0 | PN1 | PN0 | PN1 | PN0 | PN1 |
| SCG0 | SC1 | SC0 | SC1 | SC0 | SC0 | SC0 | SC0 | SC0 |
| SCG1 | SC3 | SC1 | SC2 | SC1 | SC1 | SC1 | SC1 | SC1 |
| SCG2 | SC0 | SC2 | SC0 | SC2 | SC2 | SC2 | SC2 | SC2 |
| SCG3 | SC2 | SC3 | SC3 | SC3 | SC3 | SC3 | SC3 | SC3 |

F I G. 35

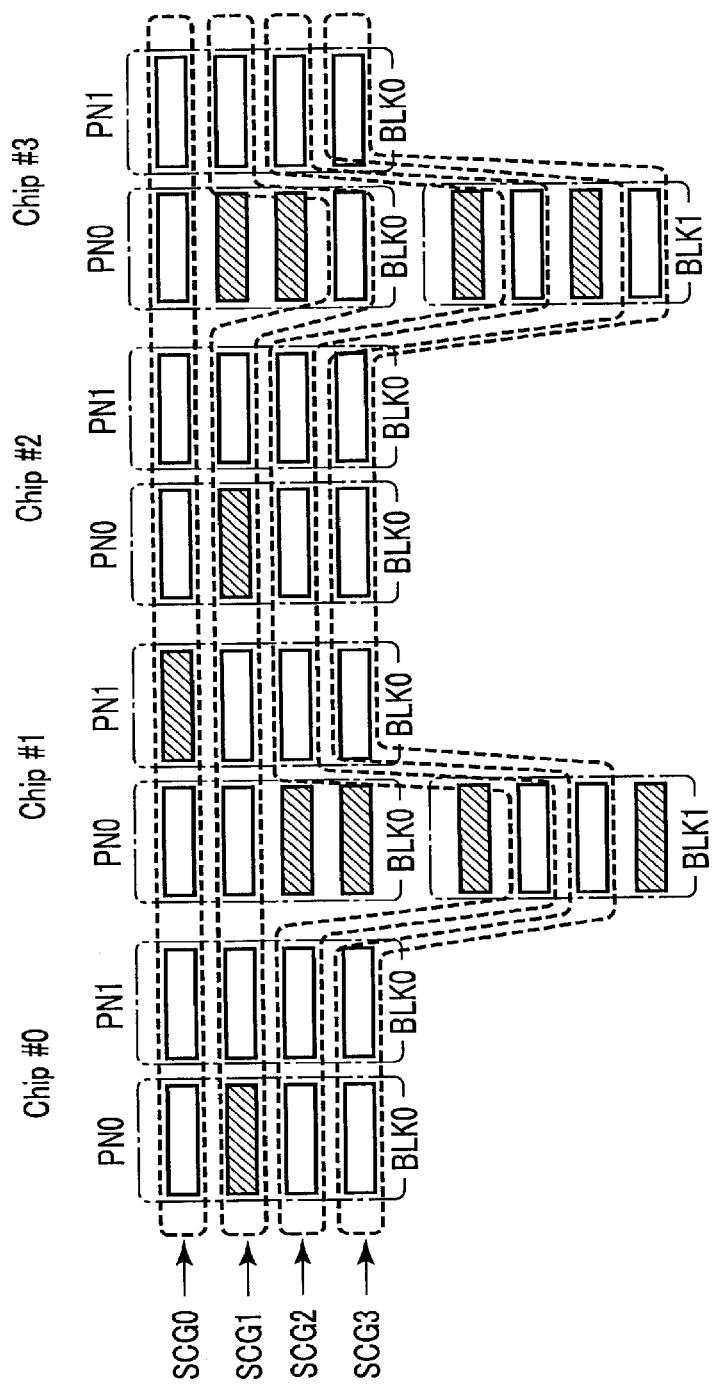
F I G. 37

|      | Chip #0 | | Chip #1 | | Chip #2 | | Chip #3 | |
|------|------|------|------|------|------|------|------|------|
|      | PN0 | PN1 | PN0 | PN1 | PN0 | PN1 | PN0 | PN1 |
| BG0  | BLK0 | BLK0 | BLK0 BLK1 | BLK0 | BLK0 | BLK0 | BLK0 BLK1 | BLK0 |

F I G. 38

|      | Chip #0 | | Chip #1 | | Chip #2 | | Chip #3 | |
|------|------|------|------|------|------|------|------|------|
|      | PN0 | PN1 | PN0 | PN1 | PN0 | PN1 | PN0 | PN1 |
| SCG0 | SC0 | SC0 | SC0 | SC0 | SC0 | SC0 | SC0 | SC0 |
| SCG1 | SC1 | SC1 | SC1 | SC1 | SC1 | SC1 | SC3 | SC1 |
| SCG2 | SC2 | SC2 | BLK1 SC1 | SC2 | SC2 | SC2 | BLK1 SC1 | SC2 |
| SCG3 | SC3 | SC3 | BLK1 SC2 | SC3 | SC3 | SC3 | BLK1 SC3 | SC3 |

F I G. 39

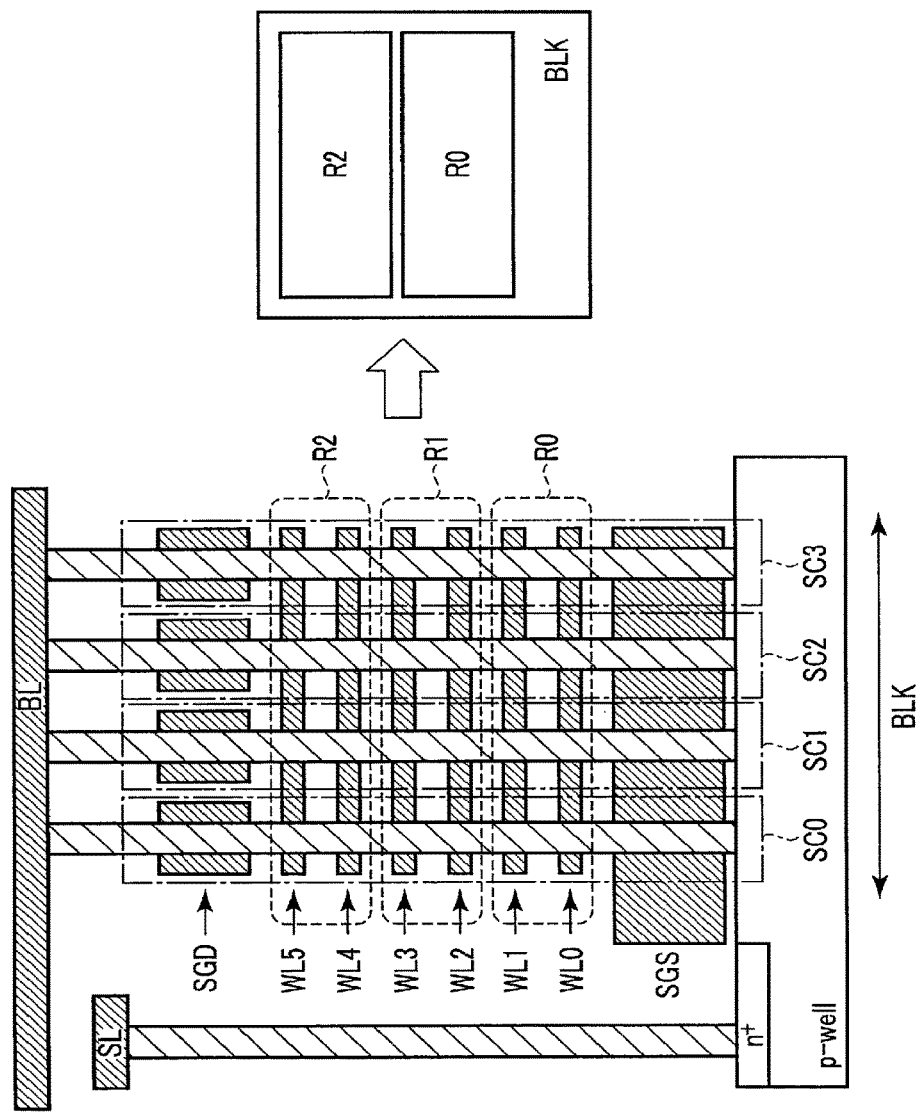
F I G. 42

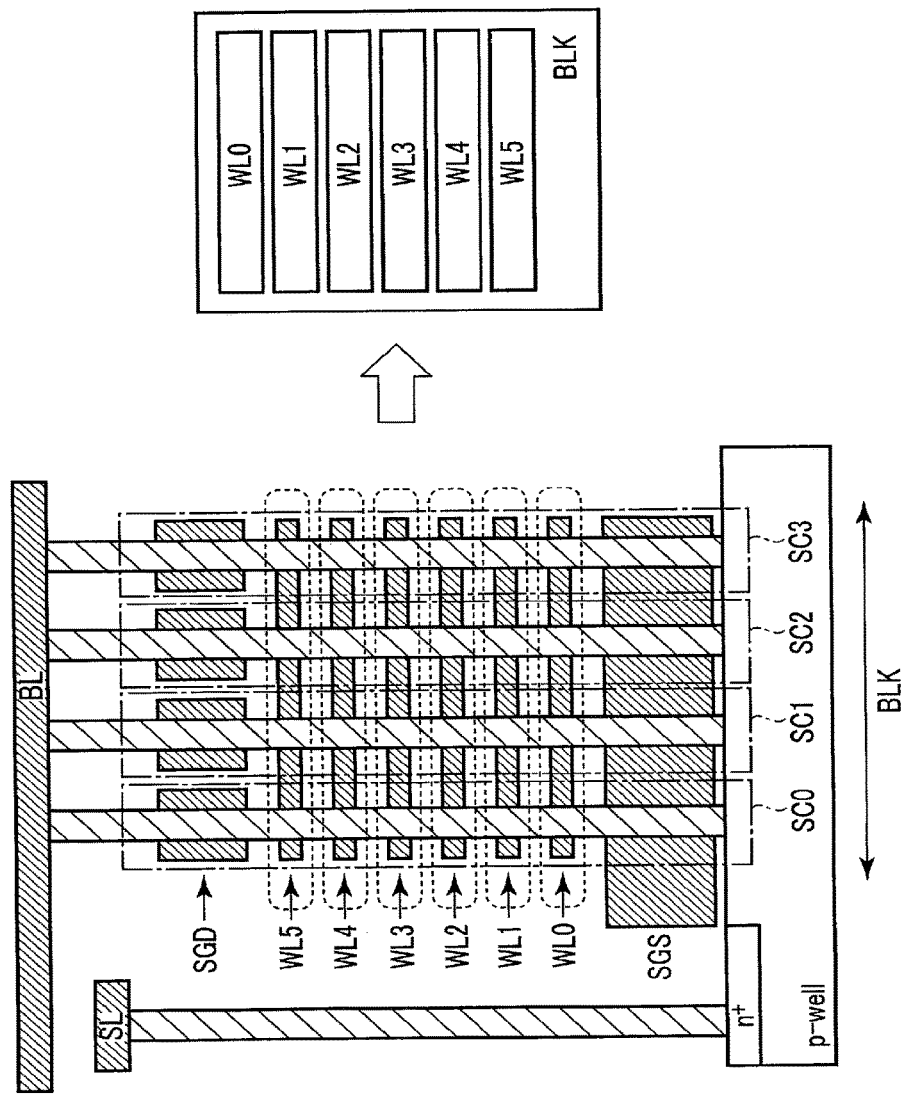
F I G. 44

MEMORY SYSTEM

CROSS-REFERENCE TO RELATED APPLICATIONS

This application claims the benefit of U.S. Provisional Application No. 62/132,244, filed Mar. 12, 2015, the entire contents of which are incorporated herein by reference.

FIELD

Embodiments described herein relate generally to a memory system.

BACKGROUND

A NAND flash memory is known in which memory cells are three-dimensionally arranged.

BRIEF DESCRIPTION OF THE DRAWINGS

FIG. 1 is a block diagram of a memory system according to a first embodiment;
FIGS. 3 and 4 are a circuit diagram and a sectional view of a memory cell array according to the first embodiment;
FIGS. 9 to 12 illustrate command sequences in a writing operation according to the first embodiment;
FIG. 15 is a schematic view of a memory according to the second embodiment;
FIG. 16 is a conceptual diagram of a PB table according to the second embodiment;
FIG. 17 is a flowchart illustrating an operation of a controller according to a third embodiment;
FIG. 18 is a schematic view of a memory according to the third embodiment;
FIG. 19 is a conceptual diagram of a BG table according to the third embodiment;
FIGS. 20 and 21 illustrate command sequences in a writing operation according to the third embodiment;
FIGS. 22 to 25 are schematic views of a memory according to the third embodiment;
FIG. 29 is a schematic view of a memory according to the fifth embodiment;
FIG. 30 is a conceptual diagram of a PB table according to the fifth embodiment;
FIG. 31 is a flowchart illustrating an operation of a controller according to a sixth embodiment;
FIG. 32 is a schematic view of a memory according to the sixth embodiment;
FIG. 33 is a conceptual diagram of a BG table according to the sixth embodiment;
FIG. 34 is a schematic view of a memory according to a seventh embodiment;
FIG. 35 is a conceptual diagram of an SCG table according to the seventh embodiment;
FIG. 37 is a schematic view of a memory according to the seventh embodiment;
FIGS. 38 and 39 are conceptual diagrams of a BG table and SCG table according to the seventh embodiment;
FIGS. 42 to 44 are schematic views of a memory according to the eighth embodiment.

DETAILED DESCRIPTION

Figure 2:
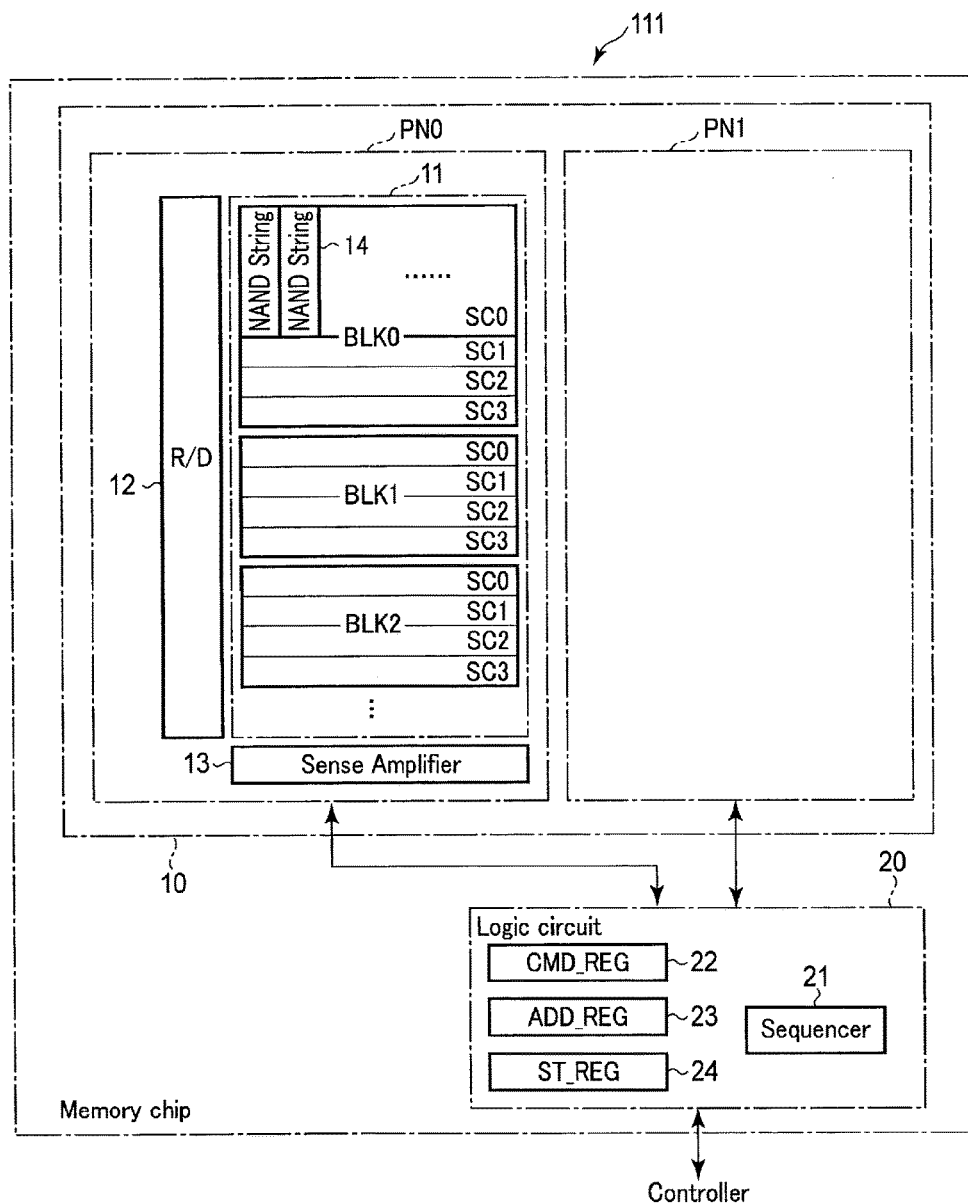
FIG. 2 is a block diagram of a semiconductor memory device according to the first embodiment.

In general, according to one embodiment, a memory system includes: a memory including a first memory chip and a second memory chip; and a controller controlling the memory. Each of the first and second memory chips includes: string units including NAND strings, wherein memory cell transistors including a charge storage layer and a control gate are connected in series in the NAND strings; and blocks including the string units. The memory holds information for the first and second memory chips indicating a partial bad block including a bad string unit, and indicating which one of string units is the bad string unit in the partial bad block.

1. First Embodiment

A memory system according to a first embodiment will be described.

1.1 Configuration of Memory System
1.1.1 Entire Configuration of Memory System

First, the configuration of the memory system according to the present embodiment will be described with reference to FIG. 1. FIG. 1 is a block diagram of the memory system according to the present embodiment.

A memory system 100 is connected with a host apparatus (referred to as a host below) 200 via a host interface (I/F) 140, and functions as an external memory device of the host 200. The host 200 is, for example, a personal computer, a mobile telephone or an imaging device. Further, the memory system 100 is a memory card such as an SD™ card or an SSD (solid state drive).

As illustrated in FIG. 1, the memory system 100 includes a memory 110, a controller 120, a data buffer 130 and the host I/F 140.

The host I/F 140 is a communication interface such as SATA (Serial Advanced Technology Attachment) or SAS (Serial Attached SCSI), and connects the memory system 100 and the host 200. The host I/F 140 receives commands such as a read command and a write command from the host 200.

The data buffer 130 temporarily stores data to be transferred to and from the host 200 and data to be transferred to and from the memory 110. Further, the data buffer 130 includes a first memory region 131, a second memory region 132 and a third memory region 133, and these regions hold information for managing the memory 110. This management information will be described in detail later. The data buffer 130 is a general-purpose memory such as an SRAM (Static Random Access Memory) or a DRAM (Dynamic Random Access Memory).

The memory 110 holds data given from the host 200 or data for managing the memory system 100. The memory 110 includes a plurality of memory chips (memory chips 0 to N where N is a natural number equal to or more than 1 in FIG. 1) 111. Each of the memory chips 111 can independently operate, and is, for example, a NAND flash memory.

The controller 120 controls the memory 110. The function of the controller 120 may be realized by a processor which executes firmware stored in a ROM (Read Only Memory) or the like included in the memory 110 or the controller 120, or by hardware. The controller 120 reads data from the memory 110 and writes data in the memory 110 according to a command from the host 200.

As illustrated in FIG. 1, the controller 120 includes a data manager 121, a read-controller 122, a write-controller 123, an erase-controller 124, an encoder 125, a decoder 126, a block grouping unit 127 and a memory I/F 128.

The encoder 125 encodes data held in the data buffer 130, and generates a code word including data and a redundant portion (parity). Any method may be adopted for an encoding method. For example, RS (Reed Solomon) encoding, BCH (Bose Chaudhuri Hocquenghem) encoding, and LDPC (Low Density Parity Check Code) encoding can be used. The decoder 126 obtains the code word read from the memory 110, from the memory I/F 128, and decodes the obtained code word. The decoder 126 notifies the read-controller 122 of a read error when error correction fails in decoding.

The memory I/F 128 is a controller which controls the memory 110. The memory I/F 128 writes in the memory 110 the code word input from the encoder 125 under control of the write-controller 123 or the like. Further, the memory I/F 128 reads the code word from the memory 110 under control the read-controller 122 or the like, and transfers the code word to the decoder 126. Furthermore, the memory I/F 128 erases data in the memory 110 under control of the erase-controller 124 or the like.

The memory I/F 128 and each memory chip 111 are connected by a bus which complies with a NAND interface. Signals to be transmitted and received on this bus include a chip enable signal/CE, an address latch enable signal ALE, a command latch enable signal CLE, a write enable signal/WE, a read enable signal/RE and an input/output signal I/O. The signal/CE is a signal for enabling the memory chip 111. The signal ALE is a signal for notifying the memory chip 111 that an input signal is an address. The signal CLE is a signal for notifying the memory chip 111 that an input signal is a command. The signal/WE is a signal for causing the memory chip 111 to take in an input signal. The signal/RE is a signal for causing the controller 120 to take in an output signal. The input/output signal I/O is a signal such as a net command, address and data.

The data manager 121 manages at which position of the memory 110 data is stored. The data manager 121 holds an address conversion table 129 which associates a logical address given from the host 200 and a physical position (physical address) on the memory 110. Further, the data manager 121 performs garbage collection according to a use status of blocks (described later) included in the memory 110. In the embodiment, the address conversion table 129 is stored in the data manager 121, but the address conversion table 129 may be stored in the DRAM or SRAM (not shown) in the controller 122. Further, or may be stored in the memory 110. The region for storing the address conversion table 129 is not ristricted The read-controller 122 executes processing of reading data from the memory 110 according to a command notified from the host 200. More specifically, the read-controller 122 obtains a physical position on the memory 110 corresponding to the physical address of read data, from the data manager 121, and notifies the memory I/F 128 of the physical position. The read data is transmitted to the host 200 through the decoder 126, the data buffer 130 or the like.

The write-controller 123 executes processing of writing data in the memory 110 according to a command notified from the host 200. More specifically, the write-controller 123 obtains a physical position on the memory 110 at which data needs to be written, from the data manager 121, and outputs the physical position and the code word output from the encoder 125, to the memory I/F 128.

The erase-controller 124 also executes processing of erasing data in the memory 110 likewise according to a command notified from the host 200.

1.1.2 Configuration of Memory Chip 111

Next, the configuration of the memory chip 111 will be described. FIG. 2 is a block diagram of the memory chip 111 according to the present embodiment. As described above, the memory chip 111 is, for example, a NAND flash memory and is a three-dimensionally stacked type NAND flash memory formed by three-dimensionally stacking memory cells above a semiconductor substrate in the present embodiment.

As illustrated in FIG. 2, the memory chip 111 roughly includes a core 10 and a logic circuit 20.

The core 10 includes a plurality of planes PN (two planes PN0 and PN1 in this example). The plane PN includes a memory cell which stores data, and is a unit which writes data in the memory cell and reads data from the memory cell. The planes PN0 and PN1 can independently operate (single-plane operation), and can operate in parallel (simultaneously) (multi-plane operation). Each plane PN includes a memory cell array 11, a row decoder 12 and a sense amplifier 13.

The memory cell array 11 includes a plurality of blocks BLK (BLK0, BLK1, BLK2 and . . . ) which is a set of a plurality of non-volatile memory cells associated with word lines and bit lines, respectively. Each block BLK includes a plurality of string chunks SC (SC0 to SC3) which is a set of NAND strings 14 in which memory cells are connected in series. Naturally, the number of blocks BLK and the number of string chunks SC in one block BLK are arbitrary.

The row decoder 12 decodes a block address or a page address, and selects one of word lines of the corresponding block BLK. Further, the row decoder 12 applies an adequate voltage to the selected word line and non-selected word lines.

The sense amplifier 13 senses data read from a memory cell to a bit line in reading of data. Further, the sense amplifier 13 transfers write data to the memory cell in writing of data. Data is read from and written in the memory cell array 11 in units of a plurality of memory cells which are page units.

The row decoder 12 and the sense amplifier 13 read data from the memory cells and write data in the memory cells.

The logic circuit 20 includes a sequencer 21, a command register 22, an address register 23 and a status register 24.

The command register 22 temporarily holds a command received from the controller 120. The address register 23 temporarily holds an address received from the controller 120, and transfers the address to the row decoder 12 and the sense amplifier 13 of the plane PN0 or PN1. The status register 24 holds various pieces of status information of the memory chip 111.

The sequencer 21 controls the entire operation of the memory chip 111 based on information of each of the registers 22 to 24. That is, the sequencer 21 controls an operation of writing, reading and erasing data in the planes PN0 and/or PN1.

1.1.3 Configuration of Block BLK

Next, the configuration of the block BLK included in the memory cell array 11 will be described with reference to FIG. 3. FIG. 3 is a circuit diagram of the block BLK.

As described above, one block BLK includes, for example, the four string chunks SC, and each string chunk SC includes a plurality of NAND strings 14.

Each NAND string 14 includes, for example, eight memory cell transistors MT (MT0 to MT7) and selection transistors ST1 and ST2. The memory cell transistor MT includes a control gate and a charge storage layer, and holds data in a non-volatile manner. Further, the memory cell transistor MT is connected in series between a source of the selection transistor ST1 and a drain of the selection transistor ST2.

Gates of the selection transistors ST1 of the string chunks SC0 to SC3 are connected to selection gate lines SGD0 to SGD3, respectively. The gates of the selection transistor ST2 are connected to, for example, a common selection gate line SGS (or may be connected to different selection gate lines SGS0 to SGS3). Further, control gates of the memory cell transistors MT0 to MT7 in the same block BLK are commonly connected to word lines WL0 to WL7, respectively.

Furthermore, the drains of the selection transistors ST1 of the NAND strings 14 in the same row in the memory cell array 11 are commonly connected to bit lines BL (BL0 to BL(L-1) where (L-1) is a natural number equal to or more than one). That is, the bit lines BL commonly connect the NAND strings 14 between a plurality of blocks BLK. Further, the sources of a plurality of selected transistors ST2 are commonly connected to a source line SL.

That is, the string chunk SC is a set of the NAND strings 14 which are connected to different bit lines BL and to one selection gate line SGD. Further, the block BLK is a set of a plurality of string chunks SC which are commonly connected to a word line WL. Furthermore, the memory cell array 11 is a set of a plurality of blocks BLK which commonly connect the bit lines BL.

Data in each plane PN is collectively written and read in and from the memory cell transistor MT connected to one of the word lines WL of one of the string chunks SC. This unit is referred to as a "page".

Further, data can be erased in block BLK units or smaller units than the block BLK units. For example, U.S. patent application Ser. No. 13/235,389 filed on Sep. 18, 2011 entitled "NONVOLATILE SEMICONDUCTOR MEMORY DEVICE" discloses an erasing method. Further, U.S. patent application Ser. No. 12/694,690 filed on Jan. 27, 2010 entitled "NON-VOLATILE SEMICONDUCTOR STORAGE DEVICE" also discloses an erasing method. Furthermore, U.S. patent application Ser. No. 13/483,610 filed on May 30, 2012 entitled "NONVOLATILE SEMICONDUCTOR MEMORY DEVICE AND DATA ERASE METHOD THEREOF" also discloses an erasing method. These patent applications are entirely incorporated herein by reference.

FIG. 4 is a sectional view of a partial region of the block BLK. As illustrated in FIG. 4, a plurality of NAND strings 14 are formed on a p-well region 30. That is, a plurality of interconnect layers 37 which function as the selection gate lines SGS, a plurality of interconnect layers 33 which function as the word lines WL and a plurality of interconnect layers 35 which function as the selection gate lines SGD are formed above the well region 30.

Further, memory holes 36 which penetrate these interconnect layers 35, 33 and 37 and reach the well region 30 are formed. In a lateral surface of the memory hole 36, a block insulation film 38, a charge storage layer 39 (insulation film) and a gate insulation film 40 are sequentially formed, and a conductive film 41 is buried in the memory hole 36. The conductive film 41 functions a current path of the NAND string 14, and is a region in which a channel is formed when the memory cell transistor MT and the selection transistors ST1 and ST2 operate.

In each NAND string 14, a plurality of (four in this example) interconnect layers 37 are commonly connected electrically and connected to the same selection gate line SGS. That is, these four interconnect layers 37 function as a gate electrode of substantially one selection transistor ST2. The same applies to the selection transistor ST1 (the selection gate lines SGD of four layers).

According to the above configuration, the selection transistor ST2, a plurality of memory cell transistors MT and the selection transistor ST1 are sequentially stacked above the well region 30 in each NAND string 14.

At an upper end of the conductive film 41, an interconnect layer 42 which functions as the bit line BL is formed. The bit line BL is connected to the sense amplifier 13.

Further, in the surface of the p-well region 30, $n^+$-impurity diffusion layer 43 and a $p^+$-impurity diffusion layer 44 are formed. A contact plug 45 is formed on the diffusion layer 43, and an interconnect layer 46 which functions as the source line SL is formed on the contact plug 45. Further, a contact plug 47 is formed on the diffusion layer 44, and an interconnect layer 48 which functions as a well interconnect line CPWELL is formed on the contact plug 47.

A plurality of the above configurations is aligned in a depth direction of FIG. 4, and a set of a plurality of NAND strings 14 aligned in the depth direction forms the string chunk SC.

In addition, the configuration of the memory cell array 11 may be another configuration. That is, U.S. patent application Ser. No. 12/407,403 filed on Mar. 19, 2009 entitled "THREE DIMENSIONAL STACKED NONVOLATILE SEMICONDUCTOR MEMORY" discloses the configuration of the memory cell array 11. Further, U.S. patent application Ser. No. 12/406,524 filed on Mar. 18, 2009 entitled "THREE DIMENSIONAL STACKED NON-VOLATILE SEMICONDUCTOR MEMORY", U.S. patent application Ser. No. 12/679,991 filed on Mar. 25, 2010 entitled "NON-VOLATILE SEMICONDUCTOR STORAGE DEVICE AND METHOD OF MANUFACTURING THE SAME" and U.S. patent application Ser. No. 12/532,030 filed on Mar. 23, 2009 entitled "SEMICONDUCTOR MEMORY AND METHOD FOR MANUFACTURING SAME" disclose the configurations of the memory cell array 11. These patent applications are entirely incorporated herein by reference.

1.1.4 Block Grouping

Next, the concept of block grouping according to the present embodiment will be described. In the present embodiment, the block grouping unit 127 of the controller 120 manages as one group (referred to as a block group BG) a set of a plurality of physical blocks BLK selected from each of a plurality of memory chips 111. Further, the controller 120 issues an access command to a plurality of blocks BLK belonging to the same block group BG when accessing a plurality of memory chips 111 in parallel.

Figure 5:
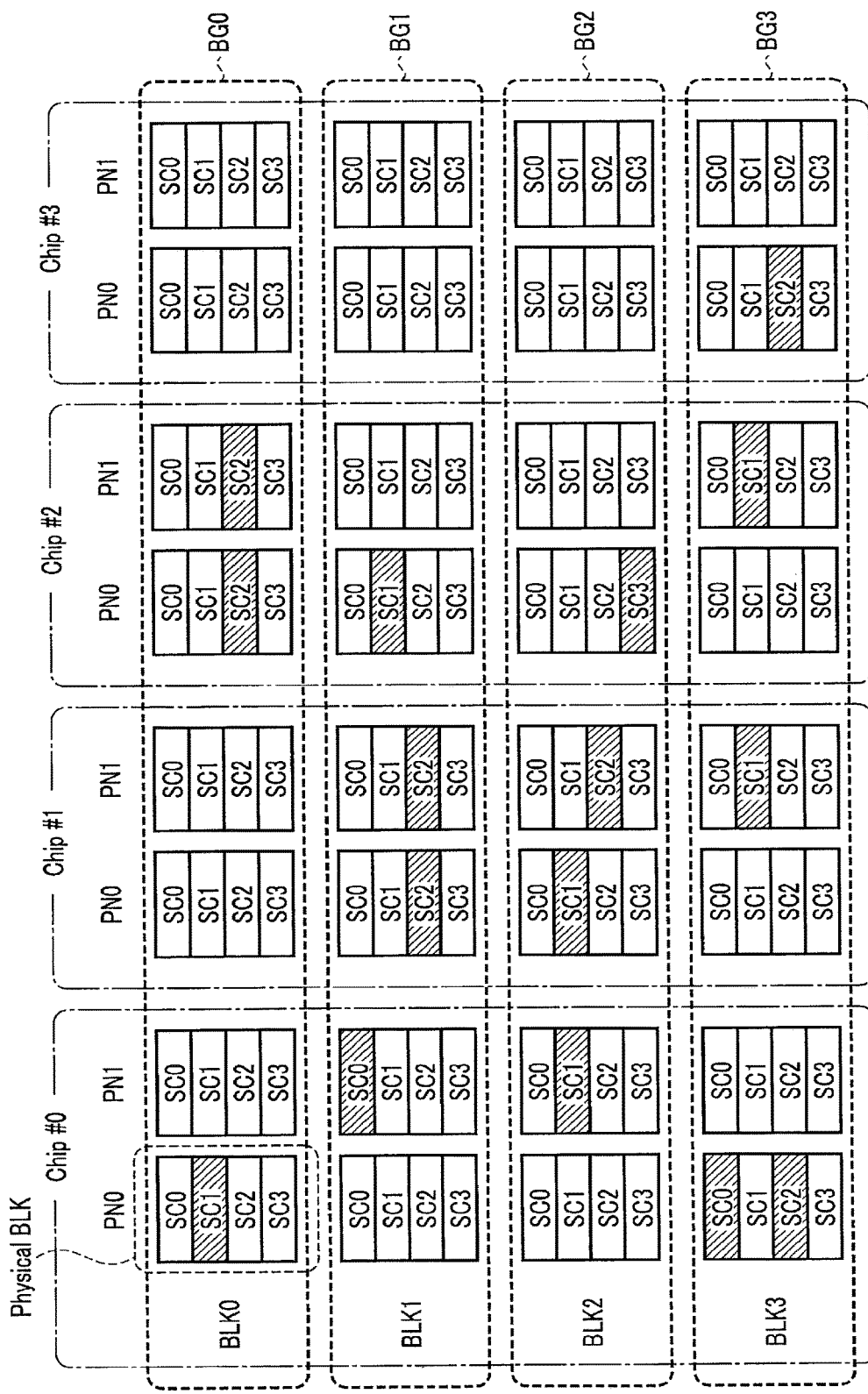
FIG. 5 is a schematic view of a memory according to the first embodiment.

FIG. 5 is a schematic view illustrating the concept of block grouping. Each of memory chips #0 to #3 includes the two planes PN0 and PN1, and each plane PN includes four blocks BLK0 to BLK3.

As illustrated in FIG. 5, the block grouping unit 127 selects the blocks BLK0 from the planes PN0 and PN1 of the memory chips #0 to #3, and manages these eight blocks BLK0 as a block group BG0. Further, the block grouping unit 127 selects the blocks BLK1 from the planes PN0 and PN1 of the memory chips #0 to #3, and manages these eight blocks BLK1 as a block group BG1. The same applies below. In addition, the string chunks SC to which is shaded in FIG. 5 include bad string chunks which cannot be used (bad string chunk: bad SC). The block grouping unit 127 groups the blocks BLK based on the above rule irrespective of which block BLK includes the bad SC.

Figures 6, 7:
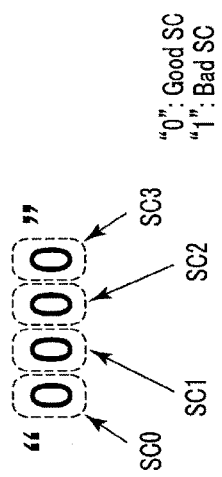
FIGS. 6 and 7 are conceptual diagrams of a BG table and a PB table according to the first embodiment.

Information related to the above block grouping is held as a table (block group table: BG table) in, for example, the first memory region 131 of the data buffer 130. FIG. 6 is a schematic view illustrating the concept of the BG table. As illustrated in FIG. 6, the BG table holds information indicating to which one of block groups BG0 to BG3 each block BLK belongs.

1.1.5 Partial Bad Block Table

Next, a partial bad block table (PB table) according to the present embodiment will be described.

As described with reference to FIG. 5, the memory cell array 11 includes the bad SC in some cases. In the present embodiment, even when the bad SC is included, if even one usable string chunk (good SC) is included, the block BLK is not designated as a bad block (unusable block), and is used. This block BLK will be referred to as a partial bad block. In addition, the number of bad SCs which is criterion for designating as a bad block or not is is arbitrary.

In above example, the good SCs are used in the partial bad block irrespective of the number of the good SCs. In other case, the good SCs may be not used and the partial bad block may be designated as a bad block when the number of the bad SCs exceeds a predetermined number.

Further, information indicating which block BLK is a partial bad block and information indicating which string chunk SC in the partial bad block is the bad SC is managed using the PB table. The PB table is held in, for example, a ROM fuse of one of the memory chips 111. Further, the PB table is read to the status register 24 according to power-on read when, for example, the memory 110 is powered on, and is held in the third memory region 133 of the data buffer 130 of the memory system 100.

FIG. 7 is an example of the PB table which corresponds to the memory 110 described with reference to FIG. 5. As illustrated in FIG. 7, the PB table holds 4 bit data per partial bad block. This 4 bit data corresponds to the string chunks SC0, SC1 and SC2 in order from an upper bit, and the lowermost bit corresponds to the string chunk SC3. Further, the corresponding string chunk SC is the good SC when the bit is "0", and is the bad SC when the bit is "1". This 4 bit data is referred to as bad string chunk (BSC (bad string chunk) information below.

Hence, in the example in FIG. 7, in an entry corresponding to the plane PN0 of the memory chip #0, the blocks BLK0 and BLK3 are registered as partial bad blocks, and "0100" and "1010" of the partial blocks are registered as BSC information. The BSC information indicating "0100" indicates that the string chunk SC1 is the bad SC, and the BSC information indicating "1010" indicates that the string chunks SC0 and SC2 are the bad SCs. Hence, in an entry corresponding to the plane PN1 of the memory chip #0, the blocks BLK1 and BLK2 are registered as partial bad blocks, and "1000" and "0100" of the partial blocks are registered as BSC information.

1.2 Operation of Memory System

Next, the operation of the memory system 100 according to the present embodiment will be described. The controllers 122, 123 and 124 according to the present embodiment refer to the BG table and the PB table when accessing the memory 110, and issue adequate commands, addresses and necessary data based on a reference result.

1.2.1 Erasing Operation

Figure 8:
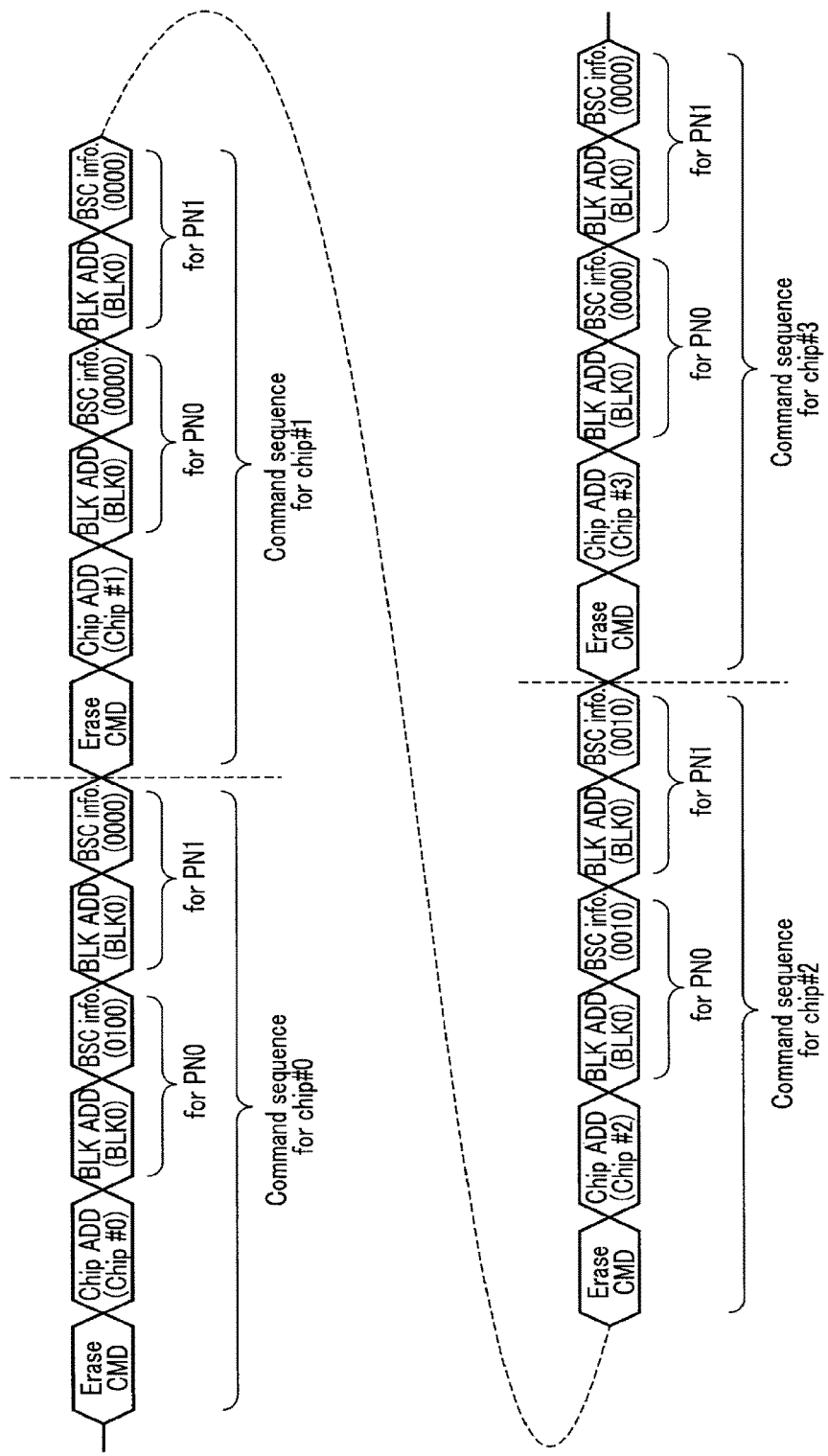
FIG. 8 illustrates command sequences in an erasing operation according to the first embodiment.

First, a data erasing operation will be described. FIG. 8 illustrates command sequences indicating a signal transmitted from the controller 120 to the memory 110 upon erasing of data. FIG. 8 illustrates only signals transmitted as the input/output signals I/O and does not illustrate the other signals /CE, ALE, CLE, /WE and /RE.

FIG. 8 illustrates an example where data of the block group BG0 illustrated in FIG. 5 is collectively erased. As illustrated in FIG. 8, the erase-controller 124 first transmits an erase command, and transmits a chip address which is an address of this erase command and designates the memory chip #0. Further, the erase-controller 124 transmits block address which designates the blocks BLK0 of the planes PN0 belonging to the block group EG0 and BSC information ("0100") of the blocks BLK0, and further transmits the block address which designates the blocks BLK0 of the planes PN1 belonging to the same block group BG0 and BSC information ("0000") of the blocks BLK0. The BSC information is obtained from the PB table. When there is no information of the corresponding blocks BLK in the PB table, it is decided that the blocks ELK do not include the bad SCs, and therefore the erase-controller 124 issues "0000" as the BSC information.

Then, the erase-controller 124 transmits the erase command and transmits a chip address which designates the memory chip #1. Further, the erase-controller 124 transmits block address which designates the blocks BLK0 of the planes PN0 belonging to the block group BG0 and BSC information ("0000") of the blocks BLK0, and further transmits block address which designates the blocks BLK0 of the planes PN1 and BSC information ("0000") of the blocks BLK0.

Commands, addresses and BSC information are transmitted likewise to the memory chips #2 and #3.

The memory chip 111 having received the command performs the erasing operation according to the received address and BSC information. The memory chip #0 erases data of the block BLK0 of the plane PN0, and data of the block BLK0 of the plane PN1 in parallel. For example, items of data in the blocks BLK are collectively erased.

Subsequently, erase-verify is performed. The erase-verify is an operation of checking whether or not a threshold of the memory cell transistor MT is sufficiently lowered as a result of the erasing operation, and is performed in, for example, string chunk SC units. More specifically, a voltage VSG is applied to the selection gate lines SGD and SGS in the erase-verify target string chunk SC, the selection transistors ST1 and ST2 are placed in an on state and an erase-verify voltage Vevfy is applied to the word lines WL0 to WL7. In this state, when currents flow from a predetermined number of the bit lines BL to the source line SL, the string chunk SC passes the erase-verify. When the string chunk SC fails to pass the erase-verify, the erasing operation is performed again.

In the erase-verify, the sequencer 21 determines the erase-verify target string chunk SC based on the received BSC information. The BSC information received from the controller 120 is held in, for example, the status register 24. The controller 120 does not erase-verify a string chunk whose bit is "1", i.e., the bad SC in the BSC information in this status register 24. Hence, in an example in FIG. 8, the sequencer of the memory chip #0 does not erase-verify the bad string chunk SC1 of the block BLK0 of the plane PN0, and finishes the erasing operation of the memory chip #0 at a point in time at which the other good string chunks SC0, SC2 and SC3 pass the erase-verify.

The same also applies to the memory chip #1 to #3 below. The memory chip #2 does not erase-verify the bad string chunk SC2 of the block BLK0 of the plane PN0 and the bad string chunk SC2 of the block BLK0 of the plane PN1 as erase-verify targets.

In addition, data can also be erased in the string chunk SC units. In this case, the operation of erasing to the bad SCs may not be performed based on the BSC information.

1.2.2 Writing Operation

Next, a data writing operation will be described. Some examples where data is written in the blocks BLK1 of the memory chips #0 and #1 in FIG. 5 in parallel, and the string chunks SC0 of the planes PN0 and PN1 are selected will be described below.

First Example

Figure 9:
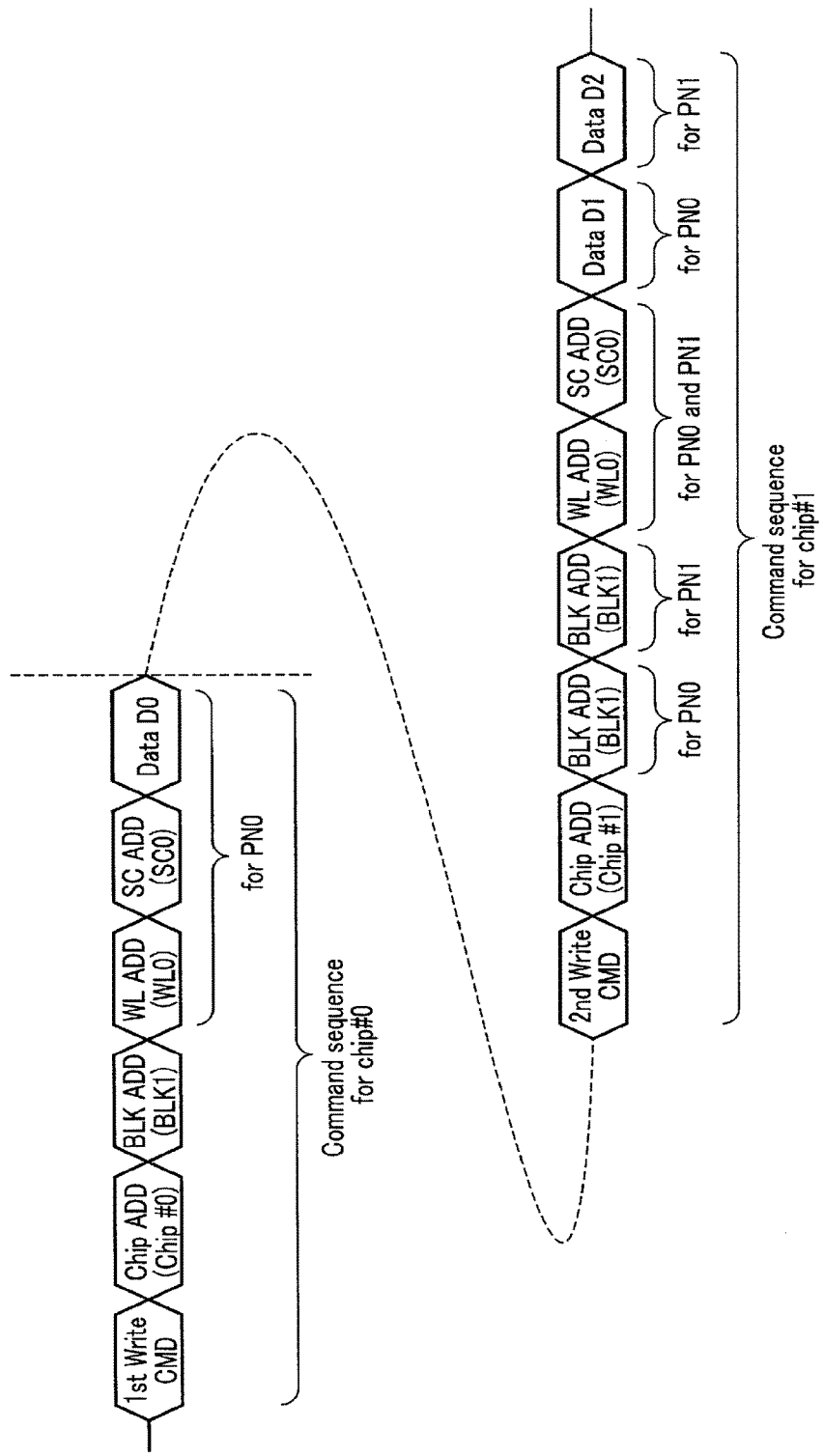

FIG. 9 illustrates command sequences indicating signals transmitted from the controller 120 to the memory 110 in writing of data according to a first example. In the present example, when the write target memory chip 111 includes the bad SC, data is not written in the bad SC by performing a single-plane operation.

When determining the memory chips #0 and #1 as write regions, the write-controller 123 of the controller 120 next refers to the PB table. Thus, the write-controller 123 recognizes that the string chunk SC0 of the block BLK1 of the plane PN1 of the memory chip #0 is the bad SC.

Then, the write-controller 123 first transmits a first write command, and transmits a chip address which is an destination of this write command and designates the memory chip #0. The first write command is a command for executing the single-plane writing operation.

Next, the write-controller 123 issues a block address which designates the block BLK1 of the plane PN0, and sequentially issues a WL address and a SC address which designates the next write target word line WL and string chunk SC0. Further, the write-controller 123 transmits write data D0 of one page from, for example, the data buffer 130 to the memory chip #0.

Next, the write-controller 123 transmits a second write command, and transmits a chip address which designates the memory chip #1. The second write command is a command for executing the multi-plane writing operation. That is, the write-controller 123 recognizes based on the PB table that the string chunks SC0 in the block BLK1 of the memory chip #1 are the good SCs in both of the planes PN0 and PN1, and therefore it is possible to perform the multi-plane operation. Hence, the write-controller 123 issues the second write command instead of the first write command.

Next, the write-controller 123 issues a block address which designates the block BLK1 in the plane PN0, and issues a block address which designates the block BLK1 in the plane PN1. Further, the write-controller 123 sequentially issues a WL address and a SC address which designates the write target word line WL and string chunk SC0. Furthermore, the write-controller 123 transmits write data D1 and D2 of one page for the planes PN0 and PN1, to the memory chip #1. In addition, in this sequence, the WL address and the SC address are commonly used in the two planes PN0 and PN1.

The memory 110 having received the command performs the writing operation according to the received address and data. First, the data D0 is written in the block BLK1 of the plane PN0 of the memory chip #0. In this regard, the data D0 is collectively written in a plurality of memory cell transistors MT connected to the word line WL0 of the string chunk SC0. The command issued to the memory chip #0 is used to cause the single-plane operation as described above, and therefore the writing operation is not performed on the plane PN1.

The writing operation is performed on the blocks BLK1 of the planes PN0 and PN1 in the memory chip #1 in parallel. That is, the data D1 and D2 is collectively written in a plurality of memory cell transistors MT connected to the word lines WL0 of the string chunks SC0 of the planes PN0 and PN1.

In addition, the command sequences described in this description are not limited to the present example, and not only the blocks BLK but also the planes PN to which the blocks BLK belong are designated by block addresses. Further, the command sequences described in this description conceptually represent information transmitted from the controller 120 to the memory 110, and the order that various pieces of information are transmitted and commands to be issued can be optionally changed. The illustrated command sequences are absolutely exemplary sequences, and, when, for example, a single-plane write command (first command) is issued, the controller 120 may issue an end command after the data D0 is transmitted. Then, the NAND flash memory 110 starts a writing operation in response to this end command. Further, when the multi-plane write command (second command) is issued, the second write command may be transmitted, then a chip address, a block address, a WL address, a SC address and data may be sequentially transmitted, a continuation command indicating that a command is continuously transmitted to another plane may be further issued, the second and subsequent write commands may be issued likewise, and an end command may finally be issued.

Second Example

Figure 10:
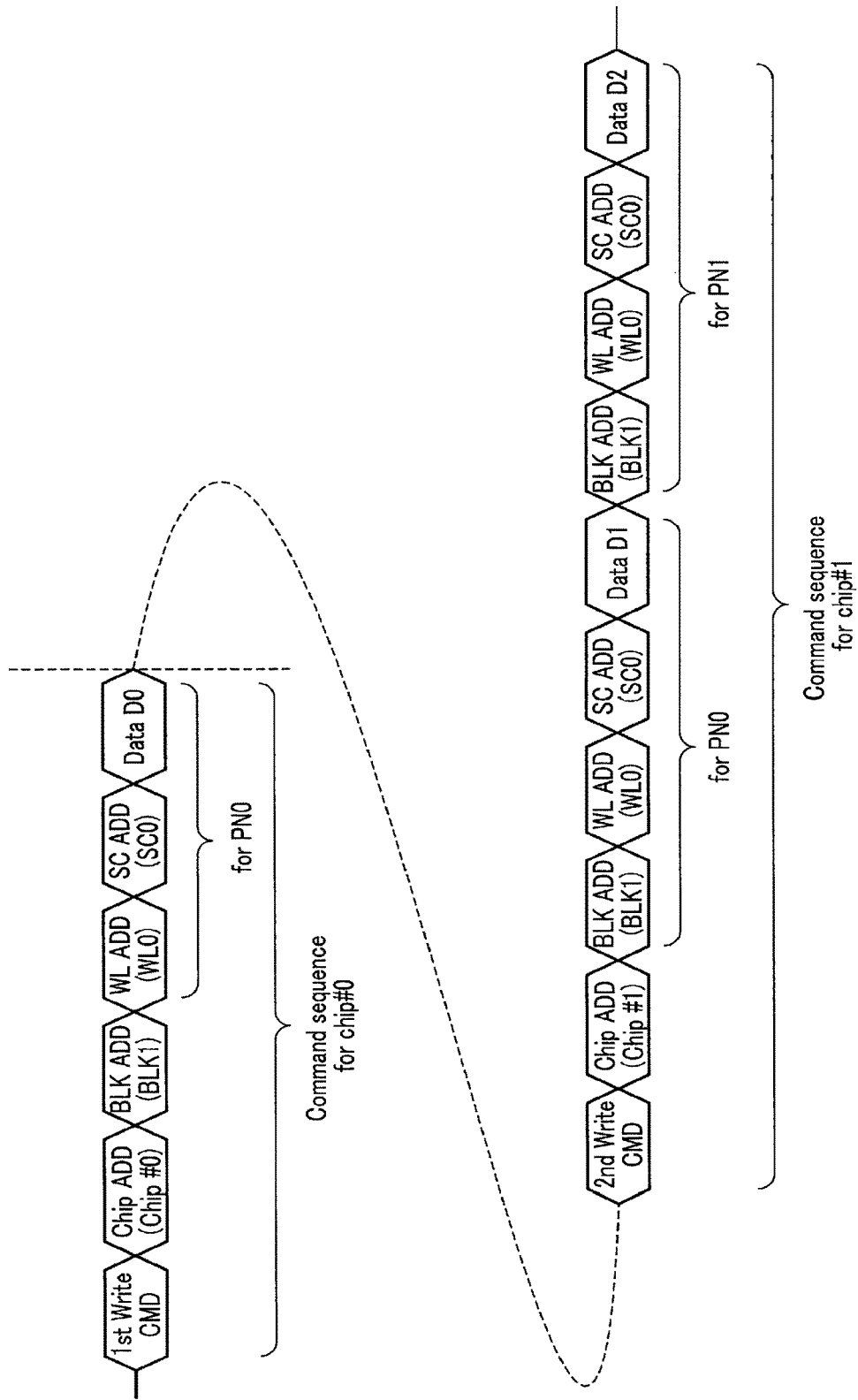

FIG. 10 illustrates command sequences according to a second example. In the present example, a block address, WL address and a SC address of each of the planes PN0 and PN1 are input to perform a multi-plane operation.

As illustrated in FIG. 10, a difference from FIG. 9 described in the first example is in the following point of a sequence related to the memory chip #1.

After a chip address is issued, a block address, a WL address, a SC address and write data corresponding to the plane PN0 are sequentially transmitted first.

Next, a block address, a WL address, a SC address and write data corresponding to the plane PN1 are sequentially transmitted.

According to the present example, it is possible to set the arbitrary values to the addresses of the write target block BLK, word line WL and string chunk SC of each plane PN.

Third Example

FIG. 11 illustrates command sequences according to a third example. In this example, a second write command is issued to the memory chip #0 including the bad SC, and a block address which is invalid for the bad SC and dummy data are issued.

As illustrated in FIG. 11, a difference from FIG. 9 described in the first example is in the following point of a sequence related to the memory chip #0.

The second write command is issued instead of the first write command.

A block address which is invalid as a block address which designates the block BLK including the bad SC in the plane PN1 is issued. The invalid block address is, for example, a physical block address which is not allocated to any of the blocks BLK of the memory chip #0.

After the write data D0 is issued, for example, the write-controller 123 issues dummy data as write data for the plane PN1.

The sequencer 21 prepares for the multi-plane operation for the memory chip #0 having received the second write command. However, the block address for the plane PN1 is an invalid address, and therefore the sequencer 21 does not perform the writing operation for the plane PN1. That is, the single-plane operation is executed with respect to the plane PN0 in the memory chip #0. Further, when writing data in the plane PN0 is finished, the memory chip #0 sets a status indicating that writing the data is normally finished, to the status register 24 (program-fail is not set). The controller 120 can obtain this status by issuing a status read command.

In addition, when an invalid block address is issued, dummy data is not necessary required, and may not be transmitted. The same also applies to the following description.

Fourth Example

Figure 12:
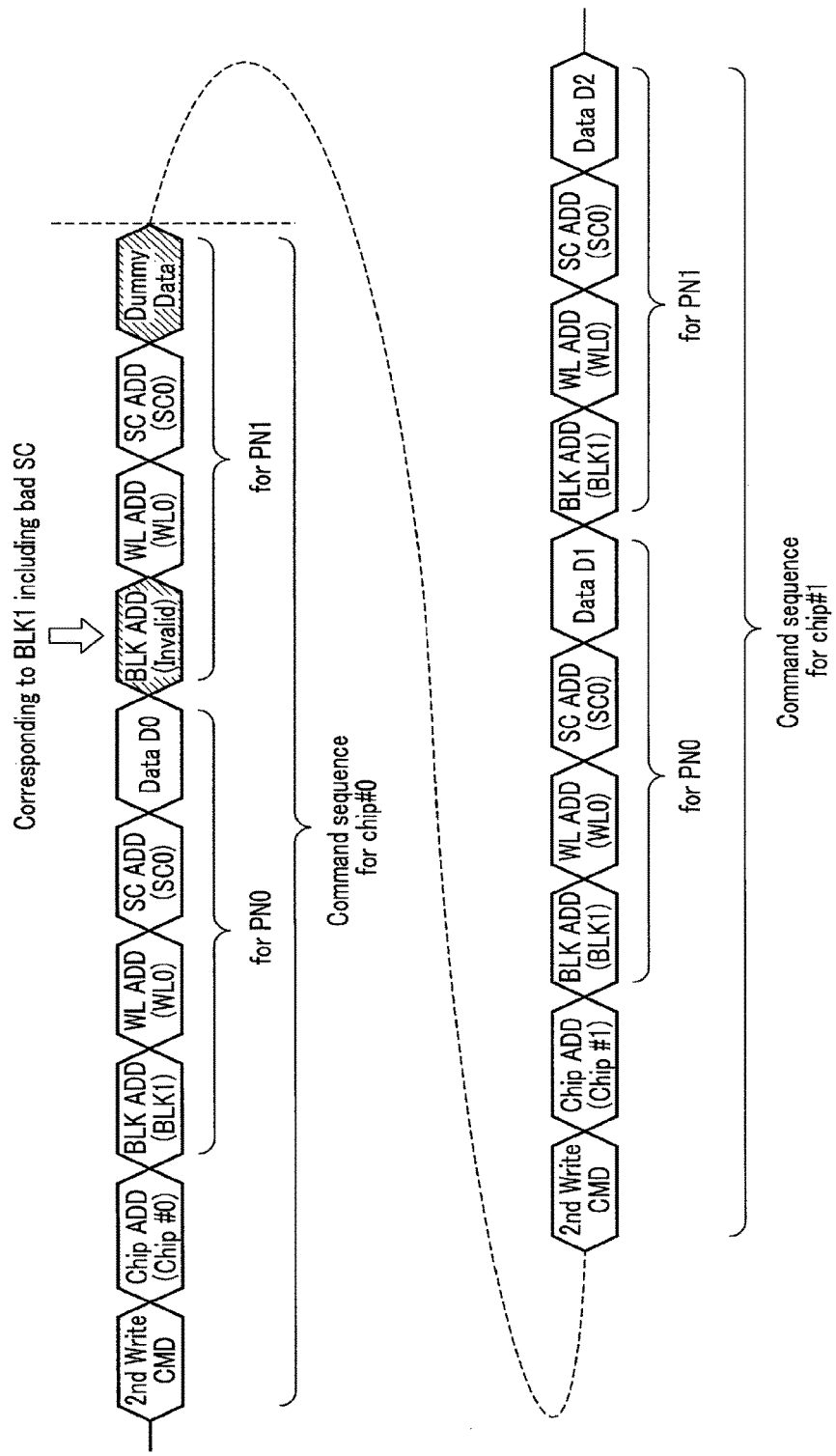

FIG. 12 illustrates command sequences according to a fourth example. According to the present example, the sequence for the memory chip #1 described in the second example with reference to FIG. 10 is applied to the memory chip #0, too, and the concept described in the third example with reference to FIG. 11 is applied to the sequence for the memory chip #0.

As illustrated in FIG. 12, a difference from FIG. 10 described in the second example is in the following point of a sequence related to the memory chip #0.

The second write command is issued instead of the first write command.

A block address, a WL address, a SC address and write data are issued to each of the planes PN0 and PN1.

A block address which is invalid as a block address of the plane PN1 is issued, and dummy data is issued as write data of the plane PN1.

The operation of the memory chip #0 is as described in the third example.

In addition, although not described, a reading operation is the same as the writing operation, and the read-controller 122 issues a read command instead of a write command.

1.3 Effect of Present Embodiment

According to the configuration of the present embodiment, it is possible to improve memory access efficiency. The effect of the present embodiment will be described below.

A memory system including a plurality of memory chips to which an access can be made in units smaller (e.g., the string chunks SC) than the size of blocks may be difficult to improve in terms of access efficiency since access to a plurality of memory chips is made in parallel.

More specifically, a case where, for example, the numbers of blocks (good BLKs) which do not include the bad SCs vary between a plurality of memory chips is assumed. In this regard, when access to a plurality of memory chips is made in parallel, a case where, while there is the good BLK which can be accessed in a given memory chip, there is not the good BLK which can be accessed in another memory chip occurs. That is, only the blocks BLK selected from a limited number of memory chips can be grouped. The same also applies to string chunk units. A case where, while there is the string chunk SC which can be accessed in a given memory chip, there is not the string chunk SC in another memory chip occurs. As a result, only the string chunks SC selected from a limited number of memory chips can be simultaneously selected. In such a case, only a limited number of memory chips can be operated in parallel, and therefore access efficiency lowers.

In this regard, BSC information is prepared per block BLK according to the present embodiment. Further, as described with reference to FIG. 5, the controller 120 groups the blocks BLK between memory chips irrespective of whether or not there are the bad SCs. Further, when access to a plurality of grouped blocks BLK is made in parallel, access to the bad SCs is inhibited based on BSC information as described with reference to FIGS. 8 to 12. That is, the controller 120 can configure a logical block (block group BG) which is a set of the physical blocks BLK without taking into account the presence of the bad SCs, and access a set of the blocks BLK or the string chunks SC selected from all memory chips 111 in parallel at all times (naturally, the controller 120 can also access only part of the memory chips 111). Consequently, it is possible to improve access efficiency for the memory 110. Further, it is possible to make access to the memory 110 in logical block units in, for example, erasing of data, and it is also possible to improve access efficiency in this case.

Figure 13:
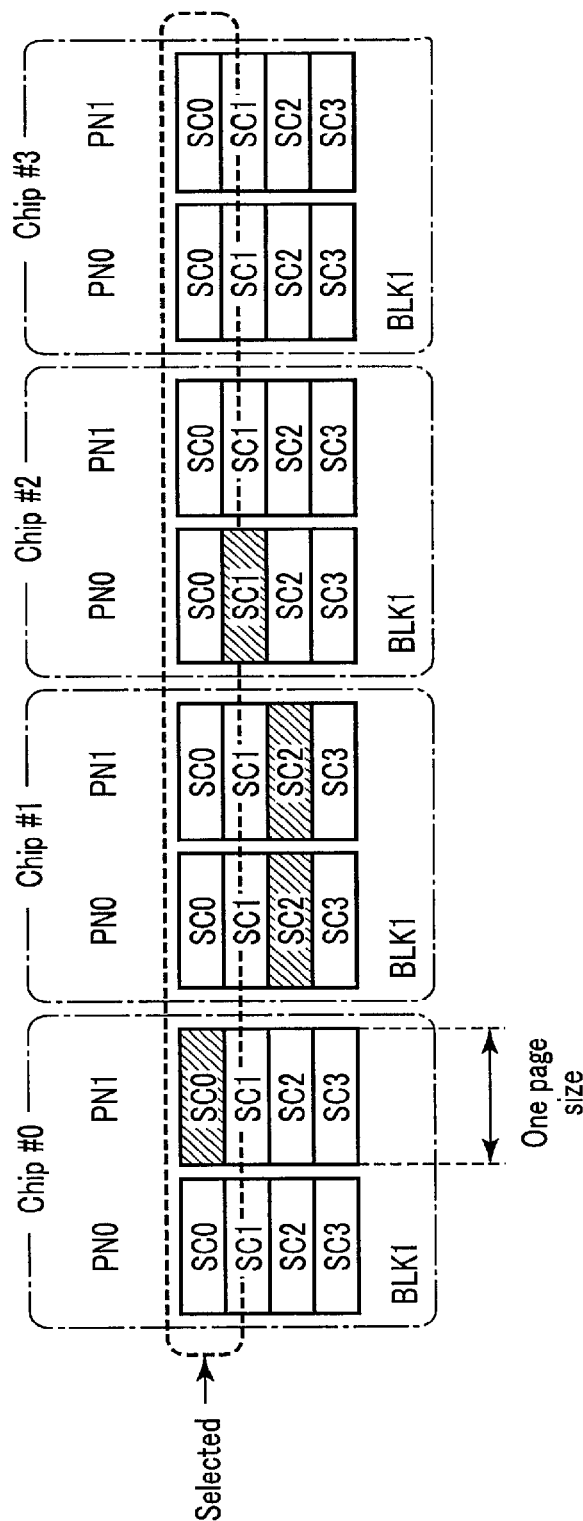
FIG. 13 is a schematic view of the memory according to the first embodiment.

FIG. 13 illustrates that a write access or a read access is made to the string chunks SC0 of the block group BG1 described with reference to FIG. 5. Access data sizes to the memory chips #0 to #3 depend on the number of bad SCs. When, for example, an access to the string chunks SC0 is made as illustrated in FIG. 13, there is the bad SC in the plane PN1 of the memory chip #0, and therefore an access data size corresponds to seven pages. The same also applies to the string chunks SC1. When an access to the string chunks SC2 is made, there are the two bad SCs in the memory chip #1, and therefore the access data size corresponds to six pages. There is no bad SC of the string chunks SC3, and therefore the access data size corresponds to eight pages. Thus, the size of data accessed in the memory chip 111 differs depending on the number of bad SCs. However, the controller 120 can access the memory chip 111 in logical block units at all times. Hence, block grouping can also be defined as an association between a given logical block and physical addresses of a plurality of blocks BLK selected from each memory chip 111. Further, in other words. the BG table can be referred as a table which indicates a correspondence relationship between this logical block and the physical blocks.

Specifically, a virtual number <BG#> is allocated to each of the block groups BG which includes a plurality of the physical blocks, and the virtual physical page address is expressed using that number <BG#>, the chip number <CH#>, the plane number <PN#>, the SC number <SC#>, and word line number <WL#>. The physical address of the physical block is determined by <BG#>, <CH#>, <PN#>, and the table shown in FIG. 6, because the table stores information about the relation between the block group BG and the physical block. The plurality of the blocks which are grouped to the same block group has the same <BG#>. An address of the logical block herein as described above indicates information of the <BG#>, that is a virtual BG address.

Furthermore, according to the configuration of the present embodiment, the PB table includes addresses of partial bad blocks and bad SC information of the partial bad blocks. That is, the PB table does not need to hold all pieces of BSC information of the blocks BLK in the memory 110, and only needs to hold the requisite minimum of information. Consequently, it is possible to reduce a data amount of management information of the memory 110.

2. Second Embodiment

Next, a memory system according to a second embodiment will be described. The present embodiment differs from the first embodiment in registering a corresponding good SC in an other plane PN, too, as a bad SC when the bad SC is found. Only differences from the first embodiment will be described below.

2.1 PB Table Creating Method

Figure 14:
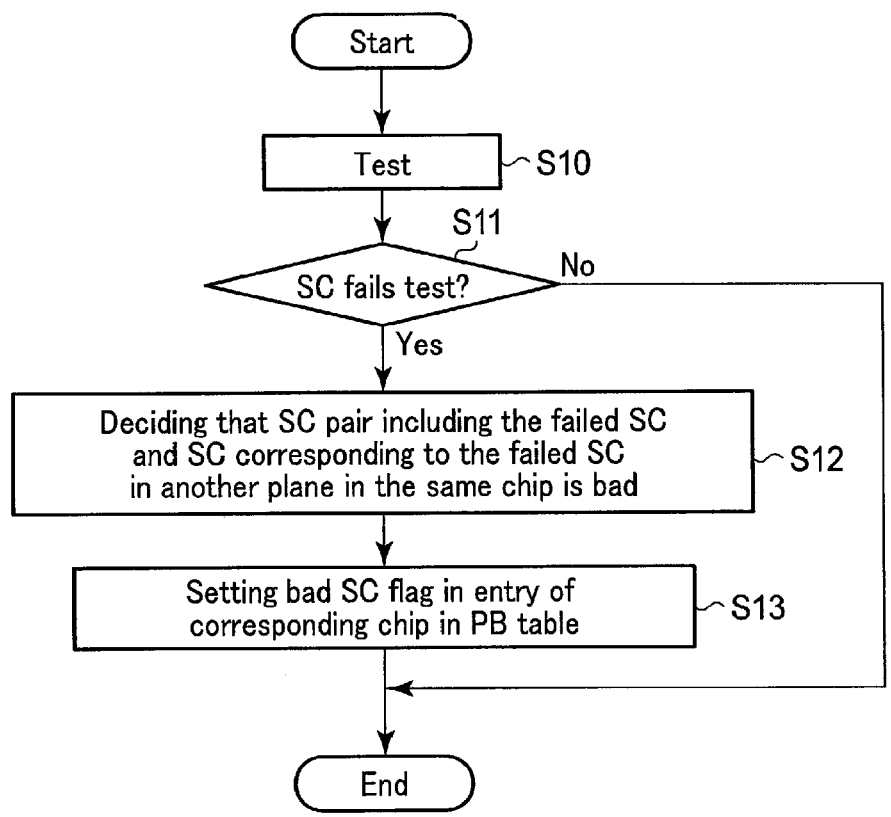
FIG. 14 is a flowchart of a PB table creating method according to a second embodiment.

The PB table creating method according to the present embodiment will be described with reference to FIG. 14. FIG. 14 illustrates that the PB table creating method is executed before, for example, a memory system 100 is shipped.

First, for example, a tester tests whether or not each string chunk SC of a memory chip 111 is bad (step S10). When the string chunk SC fails the test, i.e., when the string chunk SC is the bad SC (step S11, YES), the tester decides that the corresponding string chunk SC in the other plane PN in the same chip is also the bad SC (step S12). Further, the tester sets a bad SC flag to a corresponding entry in the PB table (step S13). In addition, a testing operation is not limited to the tester, and may be performed by a controller 120.

A specific example of the above operation will be described with reference to FIG. 15. FIG. 15 is a schematic view of a block group BG1 described in the first embodiment with reference to FIG. 5.

As illustrated in an upper view of FIG. 15, a string chunk SC0 of a block BLK1 of a memory chip 40 is the bad SC in a plane PN1 yet is the good SC in a plane PN0. Further, a string chunk SC1 of the block BLK1 of a memory chip #2 is the bad SC in the plane PN0 yet is the good SC in the plane PN1.

In this case, as illustrated in a lower view of FIG. 15, the string chunk SC0 of the plane PN0 of the memory chip #0 which is the good SC is regarded as the bad SC. Similarly, the string chunk SC1 of the plane PN1 of the memory chip #2 is regarded as the bad SC.

FIG. 16 illustrates a PB table in this case. FIG. 16 illustrates only BSC information related to the block BLK1. As illustrated in FIG. 16, in the PB table according to the present embodiment, the BSC information is commonly used between planes unlike the BSC information described in the first embodiment with reference to FIG. 7. That is, the BSC information of the block BLK1 is "1000" in the memory chip #0, and is "0010" in a memory chip #1 and "0100" in the memory chip #2.

2.2 Effect of Present Embodiment

According to the present embodiment, when the string chunk SC in one plane PN is the bad SC in the given memory chip 111, and, even when the corresponding string chunk SC in the other plane PN is the good SC, the good SC is regarded as the bad SC. As a result, as illustrated in the lower view of FIG. 15, a possible status of the two corresponding string chunks SC in the two planes PN0 and PN1 indicates one of that that both are the good SCs and both are the bad SCs.

Hence, it is not necessary to distinguish the BSC information in the PB table between the planes PN0 and PN1. That is, plane information is not necessary in the PB table, so that it is possible to further reduce an information amount of the PB table.

Further, a system which assumes that error correction is performed in multi-plane units is likely to have difficulty in error correction when one of a plurality of planes includes the bad SC. In this regard, in the present embodiment, it is possible to prevent the bad SC and the good SC from being mixed in multi-plane operation target string chunks SC, and improve error correction reliability.

In addition, the present embodiment can be optionally modified. A case where the memory chip 111 includes the two planes PN0 and PN1 has been described as an example in the above embodiment. However, the memory chip 111 may include three or more planes. Further, a configuration including four planes regards one bad SC in the same way as that in the first embodiment when there is only one bad SC. However, when, for example, the two or more string chunks SC are the bad SCs, all string chunks SC may be regarded as the bad SCs as described in the second embodiment.

3. Third Embodiment

Next, a memory system according to a third embodiment will be described. The present embodiment differs from the first and second embodiments in changing block grouping, i.e., an allocation of physical addresses of blocks BLK to logical block addresses based on a distribution of bad SCs. Only differences from the first embodiment will be described below.

3.1 Block Grouping

Next, a flow of processing of the block grouping according to the present embodiment will be described with reference to FIG. 17.

As illustrated in FIG. 17, a block grouping unit 127 checks the distribution of the bad SCs in memories 110 based on a PB table (step S20). This step may be performed after the block grouping unit 127 forms block groups BG as illustrated in, for example, FIG. 5 or in a state where the block groups BG are not formed at all.

Further, the block grouping unit 127 decides whether or not a distribution state of the bad SCs is adequate (step S21). This decision criterion will be described below using specific examples in 3.2, 3.3 and 3.4.

When the distribution of the bad SCs is not adequate (step S21, NO), the block grouping unit 127 changes a combination of the blocks BLK in each block group BG such that the distribution becomes adequate (step S22). Further, a BG table is updated (step S23). The specific examples will be described below.

3.2 Specific Example 1

In the present example, block grouping is performed to reduce a difference between data sizes to which a parallel access can be made in a writing (or reading) operation.

FIG. 18 is a schematic view of the memory 110, and the shaded regions indicate the bad SCs. As illustrated in FIG. 18, according to block grouping in an upper view of FIG. 18, when an access to string chunks SC2 of a block group BG3 is made, there are the three bad SCs, and therefore an access unit is a data size of five pages. On the other hand, even when an access to one of string chunks SC in, for example, a block group BG1 is made, there is no bad SC, and therefore the access unit is a data size of eight pages.

That is, a difference between a set of the string chunks SC having the best access efficiency and a set of the string chunks SC having the worst access efficiency is three pages in access units.

Hence, the block grouping unit 127 changes the block grouping to reduce this difference. More specifically, as illustrated in, for example, a lower view of FIG. 18, the block grouping unit 127 changes a block group to which a block BLK1 belongs from BG1 to BG3, a block group to which a block BLK2 belongs from BG2 to BG1 and a block group to which a block BLK3 belongs from BG3 to BG2 in a plane PN1 of a memory chip #0. Further, the block grouping unit 127 changes a block group to which a block BLK0 belongs from BG0 to BG1, a block group to which the block BLK1 belongs from BG1 to BG2, a block group to which the block BLK2 belongs from BG2 to BG3 and a block group to which the block BLK3 belongs from BG0 to BG1 in a plane PN0 of a memory chip #3.

As a result, the number of bad SCs included in the set of a plurality of string chunks SC to which a parallel access is made is one at maximum. That is, in an upper view of FIG. 18, an access unit difference between a set of the string chunks SC having the best access efficiency and a set of the string chunks SC having the worst access efficiency is three pages. In contrast, in a lower view of FIG. 18, the access unit difference is reduced to one page.

FIG. 19 illustrates an updated BG table in which regions encircled by bold lines are updated portions. Controllers 122, 123 and 124 access the memory 110 using the updated BG table in FIG. 19.

A write command sequence in the present example will be briefly described below. FIG. 20 illustrates command sequences when an access to a set of string chunks SC0 in FIG. 18 is made according to the sequences described in the first embodiment with reference to FIG. 11.

As illustrated in FIG. 20, a difference from FIG. 11 lies in transmitting different block addresses per PN0 and PN1 of the memory chip #0. That is, in response to a change of block grouping, an address which designates the block BLK2 is transmitted from the plane PN0, and an address which designates the block BLK3 is transmitted from the plane PN1.

Figure 21:
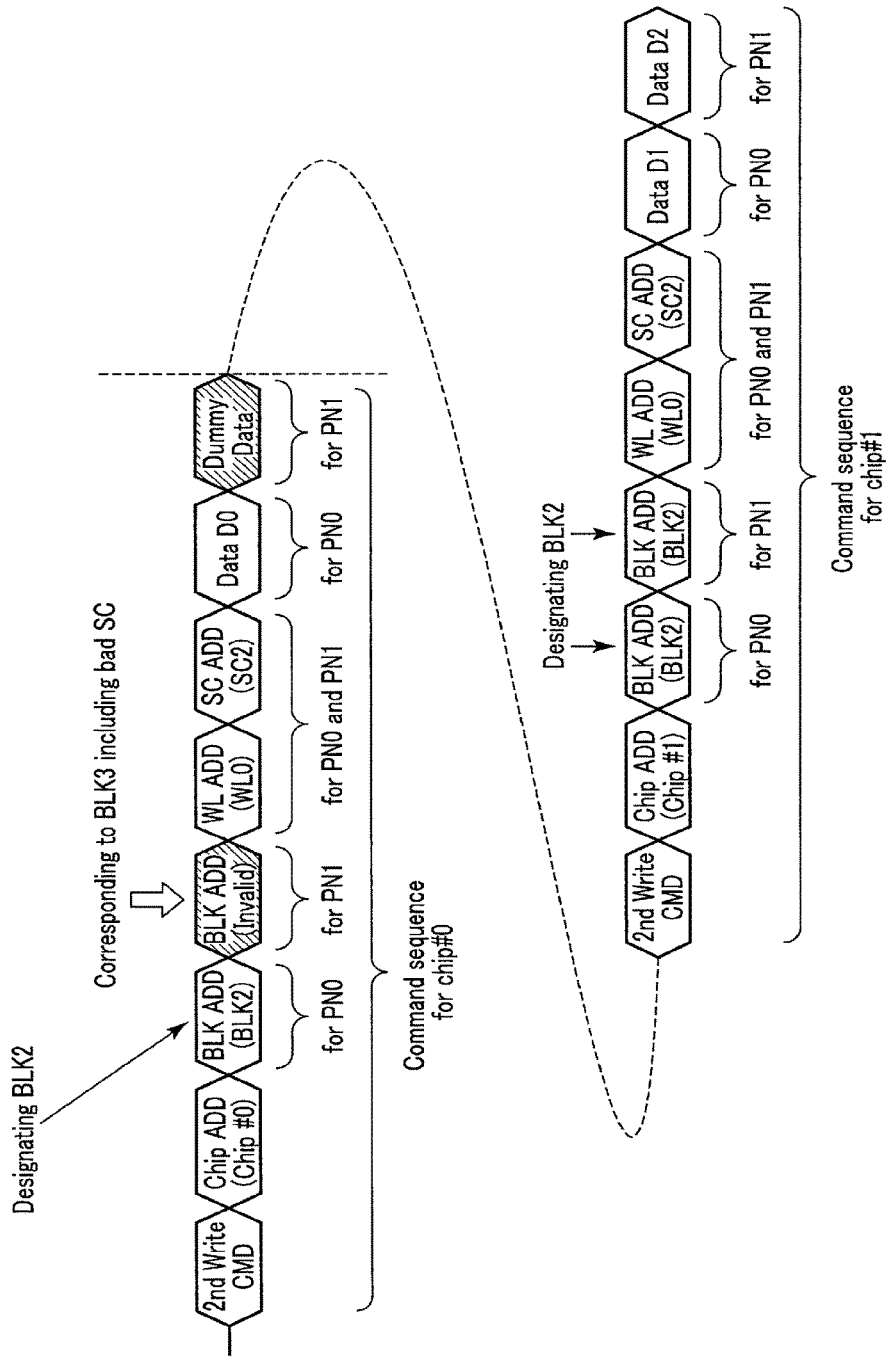

Similarly to FIG. 20, FIG. 21 illustrates command sequences when an access to a set of the string chunks SC2 in FIG. 18 is made according to the sequences in FIG. 11. In this case, similarly to FIG. 11, an invalid address is given to a block address corresponding to the plane PN1 of the memory chip #0.

In addition, an example where the access is made according to the sequences described with reference to FIG. 11 has been described with reference to FIGS. 20 and 21. However, the access may naturally be made according to the sequences described with reference to FIG. 9, 10 or 12.

3.3 Specific Example 2

Next, another example will be described. In the present example, a memory capacity difference between the block groups BG is reduced.

Figure 22:
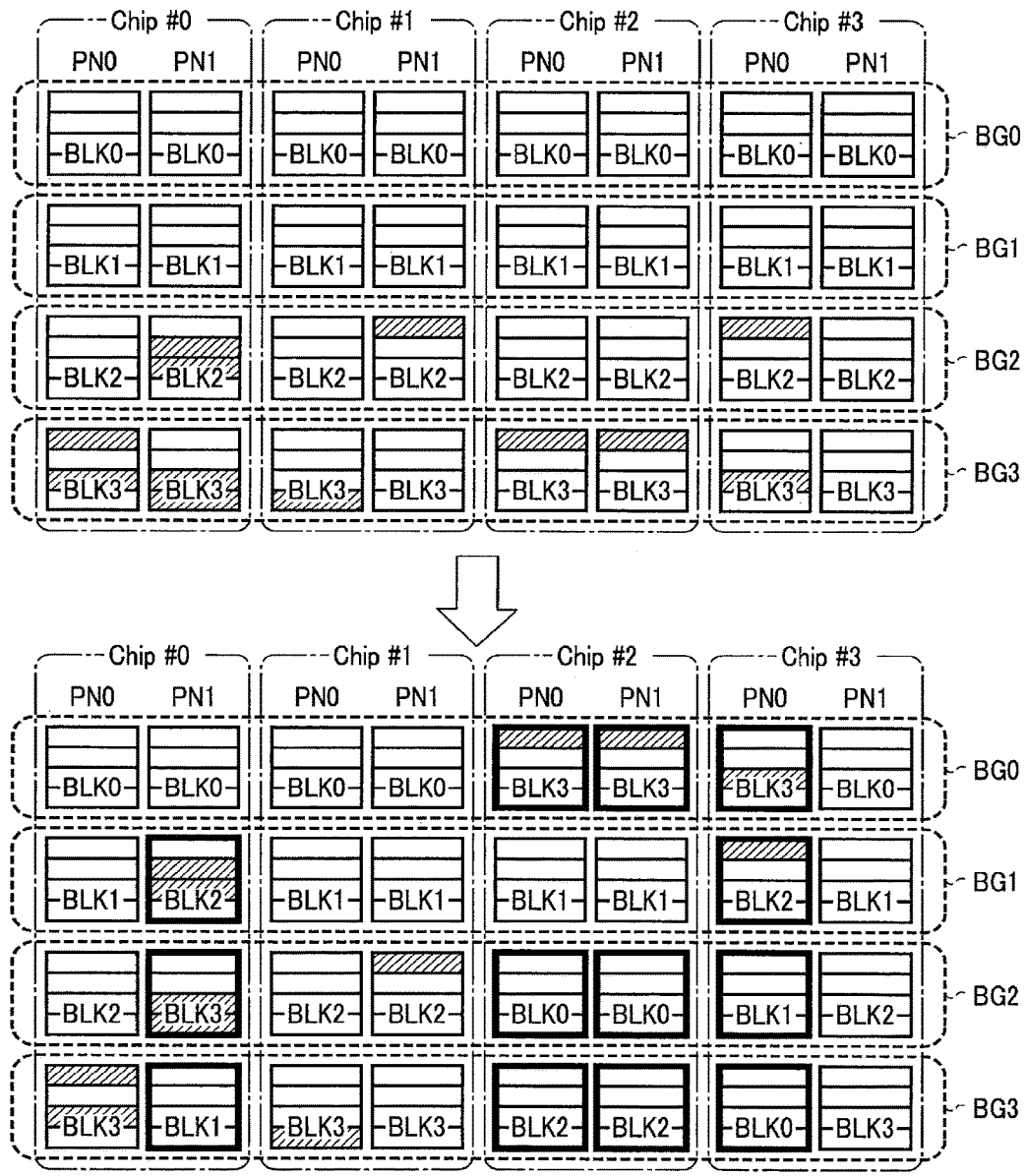

FIG. 22 is a schematic view of the memory 110, and the shaded regions indicate the bad SCs. As illustrated in FIG. 22, according to block grouping in an upper view of FIG. 22, the block groups BG0 and BG1 do not include the bad SCs, and therefore the capacity of the block groups BG0 and BG1 (an effective size or a size of an accessible region) corresponds to the 32 string chunks SC. On the other hand, the block group BG2 includes the four bad SCs, and therefore the capacity of the block group BG2 corresponds to the 28 string chunks SC and the capacity of the block group BG3 corresponds to the 24 string chunks SC.

That is, a memory capacity difference between the block groups BG0 and BG1 having the largest volume and the block group BG3 having the smallest volume corresponds to eight string chunks.

Hence, the block grouping unit 127 changes the block grouping to reduce this difference. More specifically, as illustrated in, for example, a lower view of FIG. 22, the block grouping unit 127 changes a block group to which the block BLK1 belongs, to BG3, a block group to which the block BLK2 belongs, to BG1 and a block group to which the block BLK3 belongs, to BG2 in the plane PN1 of the memory chip #0. Further, the block grouping unit 127 changes a block group to which the block BLK0 belongs, to BG2, a block group to which the block BLK2 belongs, to BG3 and a block group to which the block BLK3 belongs, to BG0 in both of the planes PN0 and PN1 of a memory chip #2. Furthermore, the block grouping unit 127 changes a block group to which the block BLK0 belongs, to BG3, a block group to which the block BLK1 belongs, to BG2, a block group to which the block BLK2 belongs, to BG1 and a block group to which the block BLK3 belongs, to BG0 in the plane PN0 of a memory chip #3. Still further, change contents are reflected in the BG table.

As a result, the numbers of bad SCs included in the four block groups BG0 to BG3 become three and equal, so that it is possible to eliminate the memory capacity difference between the block group BG.

3.4 Specific Example 3

Next, another example will be described. The above two examples can be phrased as methods of leveling a distribution of the bad SCs to reduce a size difference between a set of the string chunks SC to which an access is simultaneously made or a memory capacity difference between the block groups BG. On the contrary, in the present example, the bad SCs are collected in the specific block group BG to efficiency to access another block group BG is improved by collecting the bad SCs in the specific block group BG.

FIG. 23 is a schematic view of the memory 110, and the shaded regions indicate the bad SCs. As illustrated in an upper view of FIG. 23, a distribution of the bad SCs is not significantly biased in the memory 110, and is distributed on an average basis in each memory chip 111.

Then, the block grouping unit 127 collects the blocks BLK which do not include the bad SCs from each memory chip 111, and make the block groups BG. In the present example, the block groups BG0 and BG2 do not include the bad SCs, and are formed by the good SCs. Hence, it is possible to efficiently access these block groups BG0 and BG2. In addition, the bad SCs are intensively collected in the block groups BG1 and BG3.

Hence, the block groups BG0 and BG2 have extremely good access efficiency, and, by contrast with this, the block groups BG1 and BG3 have extremely bad access efficiency. Hence, the controller 120 may grasp the characteristics of the block groups BG, and select the block group BG to access according to write data.

3.5 Specific Example 4

Next, another example will be described. In the present example, the blocks BLK having the same numbers of bad SCs are selected from the memory chips #0 to #3, and a set of these blocks BLK forms the block groups BG. The present example corresponds to, for example, an example illustrated in FIG. 40 described later. In the example in FIG. 40, a set of the blocks BLK whose number of bad SCs is one forms the block groups BG. Thus, it is possible to improve access efficiency by grouping the blocks BLK such that the numbers of bad SCs are the same between the blocks BLK.

In addition, the blocks BLK which are block-grouped are not limited to the blocks BLK whose numbers of bad SCs are completely the same, and the blocks BLK whose numbers of bad SCs are close may be grouped. That is, when the block groups BG cannot be formed by the blocks BLK whose numbers of bad SCs are completely the same, part of the good SCs may be handled as the bad SCs to preferentially improve access efficiency.

FIG. 24 illustrates this example. An upper view of FIG. 24 illustrates that the block BLK3 of the memory chip #2 does not include the bad SC in FIG. 40 described above. In this case, when the blocks BLK whose number of bad SCs are completely the same are grouped, a set of the blocks BLK illustrated in the upper view of FIG. 24 cannot be grouped.

Hence, as illustrated in a lower view of FIG. 24, the controller 120 handles a string chunk SC3 of the block BLK3 of the memory chip #2 as the bad SC (registers the bad SC in the BSC table). As a result, the number of bad SCs included in each of the eight blocks BLK is two, and these blocks BLK are grouped.

The block group BG grouped as described above is shown in FIG. 40. The SC groups included in the block group BG (SCG0, SCG1, and SCG2 in FIG. 41) have the best access efficiency.

In addition, that "the numbers of bad SCs are close" can be defined as follows. That is, (1) a difference between the numbers of bad SCs of blocks BLK in the block group BG is a designated constant or less. That is, when a maximum value of the number of the bad SCs included in the blocks BLK of the block group BG is Nmax, and a minimum value is Nmin, Nmax−Nmin≤constant is satisfied. Alternatively, (2) a total sum of differences between a maximum value of the numbers of bad SCs included in the blocks BLK in the block group BG and the numbers of bad SCs included in the blocks BLK is a designated constant or less. That is, when the maximum value is Nmax, each block BLK is BLKi (i takes 0 to n and n is an integer) and the number of bad SCs of the block BLKi is BSC(blk_i), {Nmax−BSC(blk_0)}+{Nmax−BSC(blk_1)}+ . . . +{Nmax−BSC(blk_i)}+ . . . +{Nmax−BSC(blk_n)}≤ constant is satisfied.

3.5 Effect of Present Embodiment

According to the present embodiment, the block grouping unit 127 can arbitrarily select the blocks BLK to be included in each block group BG. It is assumed that, in, for example, the upper view of FIG. 24, all blocks BLK included in the other three block groups BG are the good BLKs (do not include the bad SCs). In this case, when the memory capacity of the block group BG is preferentially maximized, one of the block groups BG only needs to be formed by the good BLKs, and any block grouping may be performed as long as this combination is made.

Further, when the volume difference between the block groups BG is preferentially reduced, the block BLK including the bad SC may be replaced with the good BLK in each memory chip 111 as illustrated in FIG. 25. In an example in FIG. 25, the number of bad SCs included in the block group BG is one or two, so that it is possible to suppress the volume difference between the block groups BG to one string chunk SC.

Further, when access performance is preferentially optimized, in an upper view of FIG. 25, the good SC of the block BLK3 of the memory chip #2 only needs to be replaced with the bad SC as described with reference to FIG. 24.

In addition, the four specific examples have been described as the criteria for block grouping in the present embodiment.

However, block grouping may be naturally changed based on other criteria.

4. Fourth Embodiment

Next, a memory system according to a fourth embodiment will be described. The present embodiment differs from the first to third embodiments in that a data buffer 130 does not hold a PB table, and reads the PB table from a memory 110 when necessary. Only differences from the first to third embodiments will be described below.

4.1 PB Table Reading Method

Figure 26:
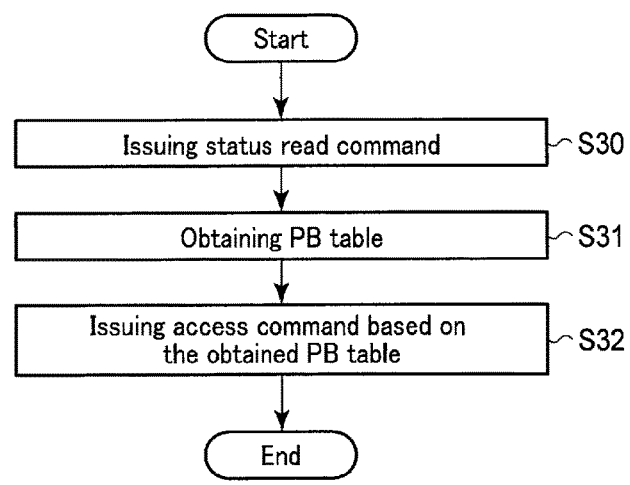
FIG. 26 is a flowchart illustrating an operation of a controller according to a fourth embodiment.

First, a PB table reading method will be described with reference to FIG. 26. FIG. 26 is a flowchart illustrating the PB table reading method.

As illustrated in FIG. 26, for example, a read-controller 122 issues a status read command at an arbitrary point in time at which the PB table becomes necessary (step S30). A memory chip 111 having received the status read command reads the PB table from a memory cell array 11, and causes a status register 24 to hold the PB table. Further, the read-controller 122 reads the PB table from the status register 24 (step S31), and accesses the memory 110 based on the read PB table as described in the first to third embodiments (step S32).

Figure 27:
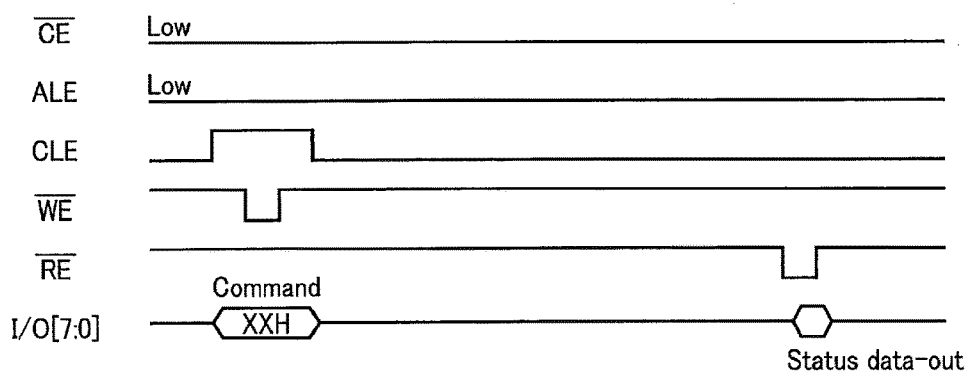
FIG. 27 is a timing chart of various signals in obtaining a PB table according to the fourth embodiment.

FIG. 27 is a timing chart illustrating signals between a controller 120 and the memory 110 upon reading of the PB table.

As illustrated in FIG. 27, the controller 120 asserts a signal/CE ("L" level), and negates a signal ALE ("L" level). In this state, the controller 120 asserts a signal CLE ("H" level), and issues a status read command ("XXH") as an input/output signal I/O. Further, when the controller 120 asserts a signal/WE ("L" level), the memory chip 111 takes in the command "XXH".

When taking in the command "XXH", the memory chip 111 reads the PB table. In this period, the memory chip 111 enters a busy state, and a ready/busy signal which is not illustrated becomes an "L" level. When the memory chip 111 returns to a ready state, the ready/busy signal becomes the "H" level, and the controller 120 asserts a signal/RE ("L" level) in response to a change in the level of the ready/busy signal. As a result, the controller 120 reads the PB table in the status register 24.

In addition, the PB table related to all memory chips 111 in the memory 110 may be held in one of the memory chips 111. In this case, the operations described with reference to FIGS. 26 and 27 are performed with respect to only one memory chip 111 which holds the PB table.

In another example, individual memory chips #0 to #N may hold PB tables of the memory chip #0 to #N, respectively. In this case, the operations described with reference to FIGS. 26 and 27 are performed with respect to the memory chips 111 which require the PB tables, respectively. That is, when, for example, the PB tables of all memory chips #0 to #N are necessary, status read commands are issued to the memory chips #0 to #N.

4.2 Effect of Present Embodiment

According to the present embodiment, the controller 120 reads the PB table from the memory 110 at a point of time at which the PB table is necessary. Hence, a dedicated region which holds the PB table becomes unnecessary in the controller 120. In, for example, the example in FIG. 1, a third memory region 133 becomes unnecessary. Consequently, it is possible to effectively use a memory space of the data buffer 130, reduce a memory capacity required for the controller and reduce cost.

In addition, the controller 120 may read the PB table from the memory 110 at any timing. For example, the timing comes when an access to the memory 110 needs to be made in response to an access command such as a read request received from a host 200.

Further, information which needs to be read according to a status read command may be only partial information in the PB table. That is, only BSC information of one of blocks BLK in the given memory chip 111 may be read.

Further, the status read command illustrated in FIG. 27 may be issued by designating the block BLK of one of the memory chip 111 (for example, a memory chip address and a block address may be issued after the command XXH in FIG. 27). Furthermore, the controller 120 reads BSC information related to the designated block BLK from a status register of the designated memory chip 111. In the example in FIG. 7, when issuing a status read command to a block BLK0 of a plane PN0 of the memory chip #0, the controller 120 reads BSC information of "0100". In the present example, each of the memory chips #0 to #3 holds BSC information of each block BLK in the status register of each of the memory chips #0 to #3. The BSC information may be read from a memory cell array to the status register upon, for example, power-on read.

5. Fifth Embodiment

Next, a memory system according to a fifth embodiment will be described. The present embodiment differs from the first to fourth embodiments that an acquired bad SC is handled. Only differences from the first to fourth embodiments will be described below.

5.1 Operation of Controller 120

Figure 28:
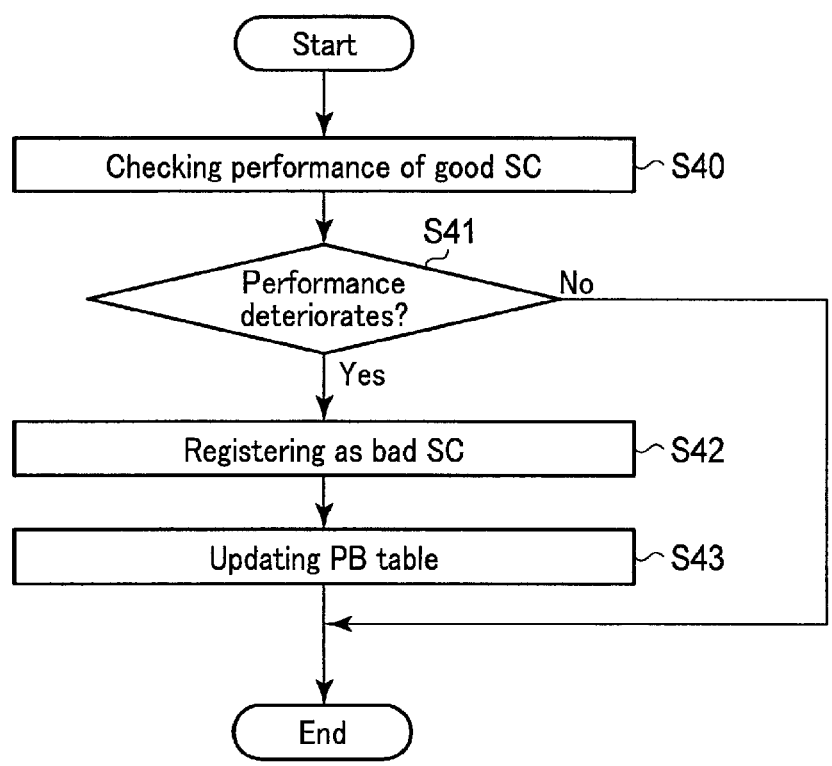
FIG. 28 is a flowchart illustrating an operation of a controller according to a fifth embodiment.

FIG. 28 illustrates an operation of the controller 120 according to the present embodiment. The controller 120 checks a state of the good SC (step S40). Further, when deciding that performance of the good SC lowers (step S41, YES), the controller 120 decides that the good SC changes to the bad SC (step S42). Further, a PB table is updated based on this result (step S43).

The above processing may be performed by, for example, a read-controller 122. In this case, in reading of data, the read-controller 122 can decide that performance of the good SC has lowered when a time required for error correction by a decoder 126 exceeds a certain period of time or the number of error bits exceeds a certain number of error bits. Further, the above processing may be performed by a write-controller 123 and an erase-controller 124. In this case, the controllers 123 and 124 issue status read commands after a writing operation and an erasing operation, and check whether or not the writing operation and the erasing operation have been normally finished. Further, when the number of times that the operations are not normally finished exceeds a certain number of times, the string chunk SC may be decided as the bad SC.

FIG. 29 is a schematic view illustrating an example where the acquired bad SC is generated. An upper view of FIG. 29 illustrates the bad SC in the PB table in power-on read. It is assumed that, as illustrated in a lower view of FIG. 29, at a given point of time, performances of string chunks SC0 and SC3 of blocks BLK3 of planes PN0 and PN1 of a memory chip #1 deteriorate in a memory 110. Further, it is assumed that performance of the string chunk SC0 of a block BLK2 of the plane PN0 of a memory chip #2, and performances of the string chunks SC0 and SC3 of the block BLK2 of the plane PN1 deteriorate. Then, as indicated in a PB table in FIG. 30, new BSC information is written in entries corresponding to the memory chips #1 and #2.

5.2 Effect of Present Embodiment

According to the present embodiment, when performances of the string chunks SC lower after the memory system is shipped, and cannot be appropriately used, these string chunks SC can be handled as the bad SCs. Thus, by updating the PB table according to a state of the memory system, it is possible to perform adequate management even when the state of the memory system changes.

Further, the controller 120 may write the updated PB table in the memory 110.

6. Sixth Embodiment

Next, a memory system according to a sixth embodiment will be described. The present embodiment differs from the fifth embodiment in not only updating a PB table but also updating a BG table. Only differences from the fifth embodiment will be described below.

6.1 Operation of Controller 120

FIG. 31 illustrates an operation of the controller 120 according to the present embodiment. As illustrated in FIG. 31, after steps S40 to S43 described in the fifth embodiment with reference to FIG. 28, a block grouping unit 127 decides whether or not it is necessary to change block grouping. An example of a necessity decision criterion is as described in 3.2, 3.3 and 3.4 in the third embodiment. When deciding that it is desirable to change block grouping, the block grouping unit 127 updates a BG table (step S44).

FIG. 32 illustrates that, after a PB table is updated as described with reference to FIG. 29, block grouping is updated. An upper view of FIG. 32 corresponds to the lower view of FIG. 29. The block grouping unit 127 switches block groups BG to which blocks BLK1 and BLK3 of a plane PN1 of a memory chip #1 belong. Further, the block grouping unit 127 changes the block group BG to which a block BLK2 of the plane PN1 of a memory chip #2 belongs, to BG0. FIG. 33 illustrates a BG table in this case. In FIG. 33, portions encircled by bold frameworks correspond to the changed blocks BLK. By changing block grouping in this way, it is possible to reduce a volume difference in access units between a set of string chunks SC to which a parallel access is made, and reduce a volume difference between the block groups BG.

6.2 Effect of Present Embodiment

According to the present embodiment, it is possible to perform adequate block grouping even when the acquired bad SC is generated.

In addition, a timing to update the PB table and a timing to update the block group BG does not necessarily match. When, for example, error correction (ECC) is performed using block grouping, if there is no effective data in the block group BG and an erasable state (or unwritten state) is not provided, block grouping cannot be changed in some cases. Further, replaceable blocks BLK are necessary to change block grouping. Hence, when the acquired bad SC is generated, the controller 120 registers this bad SC as the bad SC. Further, even when it is decided that it is better to change block grouping, if there is not a replaceable block, block grouping is not changed. Furthermore, when the replaceable block group BG or one given block BLK can be used, the block grouping may be changed. In addition, this "one given block BLK" is, for example, the block BLK such as a preliminary block which is not block-grouped (referred to as Single BLK). Data is written in or erased from the block-grouped block BLK in block group points, and error correction is also performed in the block group units. By contrast with this, data is written in or erased from the single BLK in single BLK units. Consequently, it is possible to change the block-grouping if there is a single BLK which is in an unwritten state or an erasable state and which can be suitably replaced.

7. Seventh Embodiment

Next, a memory system according to a seventh embodiment will be described. The present embodiment differs from the first to sixth embodiment in changing not only a combination of blocks BLK but also a combination of string chunks SC to which a parallel access can be made similarly to the third embodiment. Only differences from the first to sixth embodiments will be described.

7.1 String Chunk Grouping (SC Grouping)

In the above embodiments, a region of a given block group BG to which a parallel access is made is a set of string chunks SC0, a set of string chunks SC1, a set of string chunks SC2 and a set of string chunks SC3. In this regard, in the present embodiment, the string chunks SC0 to SC3 are arbitrarily block-grouped (referred to as SC grouping) similarly to block grouping.

The SC grouping may be performed by, for example, a block grouping unit 127 in FIG. 1 or a SC grouping unit additionally provided in a controller 120.

FIG. 34 is a schematic view illustrating a concept of the SC grouping, and the shaded regions indicate the bad SCs. An upper view of FIG. 34 illustrates cases of the first to sixth embodiments. By contrast with this, as illustrated in a lower view of FIG. 34, the string chunk SC1 of a plane PN0 and the string chunk SC0 of a plane PN1 of a memory chip #0, the string chunk SC1 of the plane PN0 and the string chunk SC0 of the plane PN1 of a memory chip #1, the string chunks SC0 of the planes PN0 and PN1 of a memory chip #2 and the string chunks SC0 of the planes PN0 and PN1 of a memory chip #3 are grouped (referred as string chunk group SCG).

In this regard, for example, the block grouping unit 127 or the SC grouping unit causes, for example, a second memory region 132 of a data buffer 130 to hold a SCG table which holds a relationship between the string chunk groups SCG and the string chunks SC included in the string chunk groups SCG. FIG. 35 illustrates an example of the SCG table. In an example in FIG. 35, string chunk groups SCG0 and SCG1 do not include the bad SCs, and string chunk groups SCG1 and SCG2 include the three bad SCs.

Figure 36:
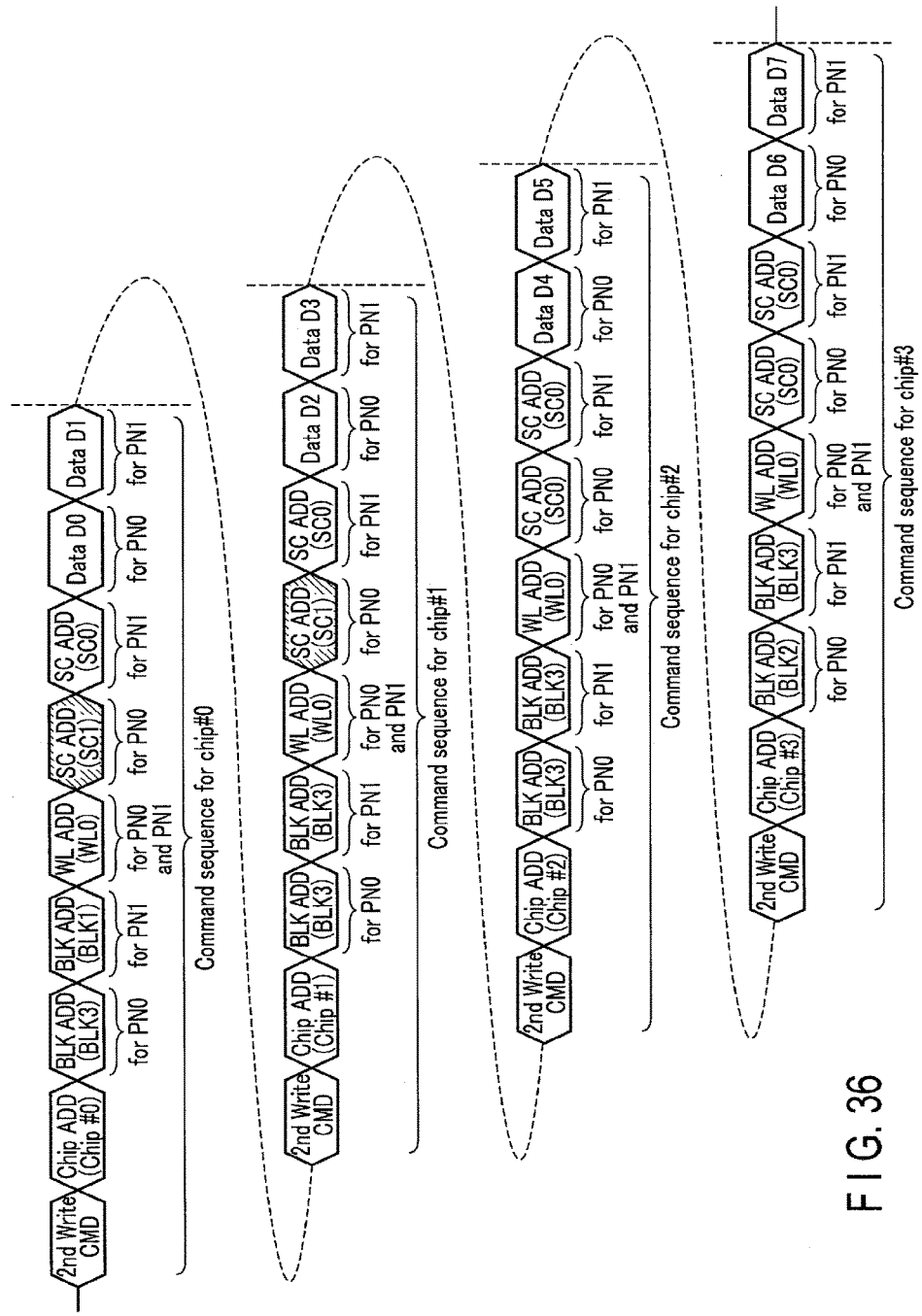
FIG. 36 illustrates command sequences in a writing operation according to the seventh embodiment.

FIG. 36 illustrates command sequences of making a write access to the string chunk group SCG0 described with reference to FIGS. 34 and 35. In the present embodiment, the string chunk SC needs to be designated per plane of each memory chip, and therefore is designated according to the sequences described in the first embodiment with reference to FIG. 12. As illustrated in FIG. 36, a write-controller 123 refers to the SCG table, and transmits addresses which designate the string chunks SC1 as SC addresses of the planes PN0 of the memory chips #0 and #1.

7.2 Other Example of SC Grouping (1)

Various methods of performing SC grouping can be adopted. FIG. 37 is a schematic view illustrating another example of SC grouping.

As illustrated in FIG. 37, in an example in FIG. 37, a block BLK0 is selected from the planes PN1 of the memory chips #0 and #1 and the planes PN1 of the memory chip #2 and #3, and two blocks BLK0 and BLK1 are selected from the plane PN0 of the memory chip #1 and the plane PN0 of the memory chip #3 to form a string chunk group.

Hence, how block grouping is performed differs from those of the first to sixth embodiments. FIG. 38 illustrates part of the BG table according to the present embodiment, and corresponds to the example in FIG. 37. As illustrated in FIG. 38, the two blocks BLK0 and BLK1 are registered in entries corresponding to the plane PN0 of the memory chip #1 and the plane PN0 of the memory chip #3.

Further, FIG. 39 is a schematic view of the SCG table according to the present embodiment. In the present example, information of blocks to which the string chunks SC belong is registered in entries corresponding to the planes PN0 of the memory chips #1 and #3 in at least the string chunk groups SCG2 and SCG3.

7.3 Other Example of SC Grouping (2)

Figures 40, 41:
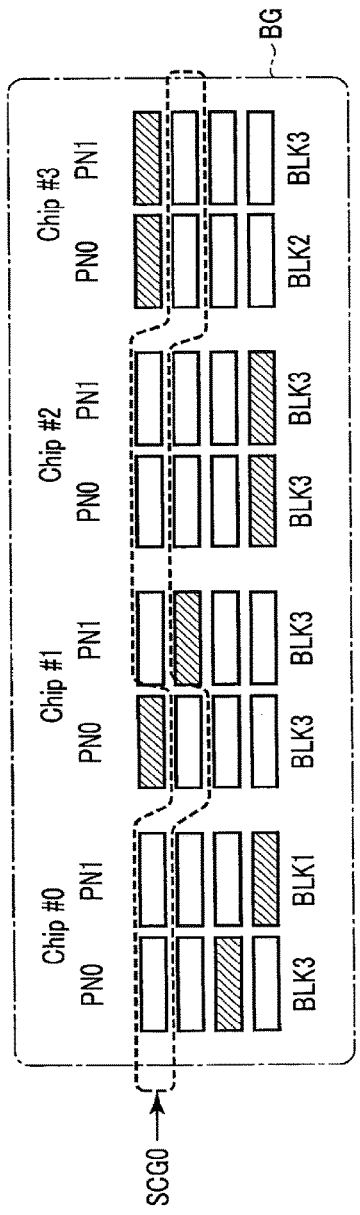
FIG. 40 is a schematic view of a memory according to the seventh embodiment.
FIG. 41 is a conceptual diagram of the SCG table according to the seventh embodiment.

FIG. 40 is a schematic view illustrating another example of the SC grouping.

In the present example, the block groups BG are formed by collecting blocks whose the number of bad SCs included in the blocks BLK are the same or close, and the string chunk groups SCG are formed in that block groups BG. In the example in FIG. 40, all blocks BLK included in the given block group BG include the three good SCs and one bad SC.

In this case, the string chunk group SCG can be formed as illustrated in, for example, FIG. 41. That is, the three string chunk groups SCG0 to SCG2 are formed only by the good SCs, and the SCs included in SCG3 are all bad SCs.

7.4 Effect of Present Embodiment

According to the present embodiment, it is possible to arbitrarily group not only the blocks BLK but also sets of the string chunks SC to which a parallel access can be made. Consequently, it is possible to improve access efficiency more. In addition, a criterion for performing string chunk grouping may be based on the idea described in 3.2, 3.3 and 3.4 in the third embodiment or may be another criterion.

8. Eighth Embodiment

Next, a memory system according to an eighth embodiment will be described. A controller 120 according to the first to seventh embodiments manages a memory 110 in logical block units, and further manages good regions and bad regions in string chunk SC units smaller than physical blocks BLKs in each logical block. The present embodiment relates to a unit different from the string chunks SC.

8.1 First Example

In the first example, management is performed in layer units in the blocks BLK. FIG. 42 is a schematic view of the present example, and illustrates six word lines WL.

As illustrated in FIG. 42, the six word lines WL are classified into three layers, word lines WL0 and WL1 belong to a layer R0, word lines WL2 and WL3 belong to a layer R1 and word lines WL4 and WL5 belong to layer R2. The blocks BLK are managed in units of the two layers R0 and R2.

When failure is found in the layer R0 and is not found in the layer R2 upon a test, the layer R2 is regarded as a good layer and the layer R0 is regarded as a bad layer. In this case, the layer R1 may be also regarded as a bad layer. The same also applies to the reverse case. When all layers R0 to R2 are the good layers, the blocks BLK are naturally the good BLKs. Thus, management may be performed in units of the layers R0 and R2 instead of the string chunks SC. Naturally, the number of layers is not limited to two.

8.2 Second Example

Figure 43:
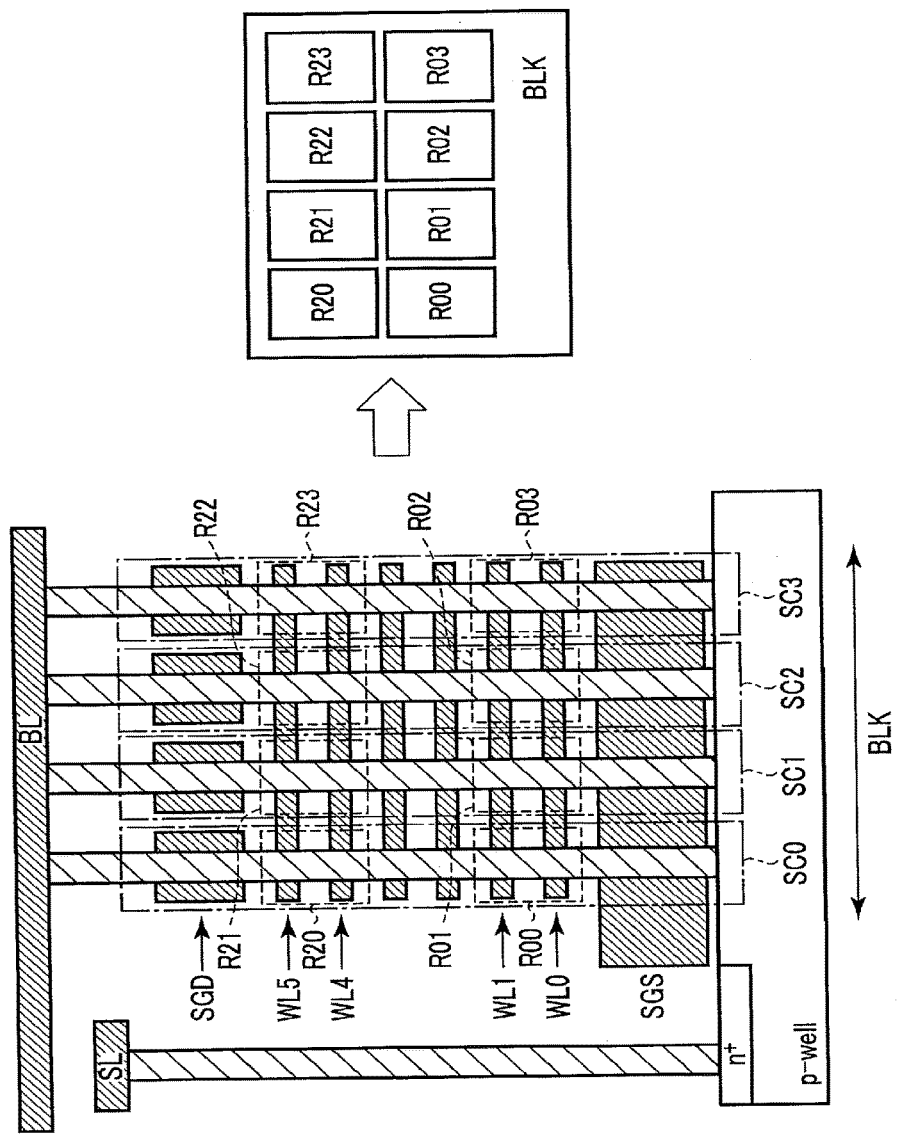

In a second example, string chunk units described in the first to seventh embodiments and layer units described in the above first example are combined. FIG. 43 is a schematic view of this second example. As illustrated in FIG. 43, regions which belong to the layer R0 and belong to string chunks SC0 to SC3 are managed as regions R00 to R03, and regions which belong to the layer R2 and belong to the string chunks SC0 to SC3 are managed as regions R20 to R23. In this case, the block BLK is managed by eight smaller regions.

8.3 Third Example

The third example illustrates that management is performed in word line units. FIG. 44 illustrates this state. In the present example, the blocks BLK are managed in word line WL units used commonly between a plurality of string chunks SC.

8.4 Effect of Present Embodiment

As described in the present embodiment, block BLK management units are not limited to the string chunks SC, and are not limited as long as the management units are smaller than the blocks BLK. In this regard, management is preferably performed in units larger than pages from a view point of a management information amount.

9. Modified Example

As described above, a memory system 100 according to an embodiment includes:
a memory (110 in FIG. 1) including a first memory chip (chip #0 in FIG. 1) and a second memory chip (chip #1 in FIG. 1); and a controller (120 in FIG. 1) controlling the memory. Each of the first and second memory chips includes: string units (SC0 to SC3 in FIG. 5) including NAND strings in which memory cell transistors including charge storage layers and control gates are connected in series; and blocks (BLK0 to BLK3 in FIG. 5) including the string units. The memory holds information for the first and second memory chips indicating partial bad blocks including bad string units, and indicating which one of the string units is the bad string unit in the partial bad block (BSC table in FIG. 7).

The configuration includes failure information in block units, and failure information in string units of each block. Consequently, it is possible to improve access efficiency in a memory system which includes a plurality of memory chips, and can perform a multi-plane operation.

In addition, the embodiments are not limited to the above described embodiments, and can be variously deformed and can be arbitrarily combined and carried out.

For example, each element in a controller 120 may be realized by software to be executed by a processor, by hardware or by a combination thereof. Further, first to third memory regions 131 to 133 in a data buffer 130 may be independent memory chips or may be different regions in the same memory chip.

Further, processing orders in the flowcharts described in the above embodiments can be switched where necessary or may be omitted.

Furthermore, the above embodiments are not limited to the configuration where memory cells are three-dimensionally stacked. The above embodiments are applicable to, for example, a normal flat NAND flash memory formed by two-dimensionally aligning memory cell transistors MT and selected transistors ST on a semiconductor substrate. Further, a memory system is not limited to a NAND flash memory and is generally applicable to memory systems which can be managed in at least two units (the blocks BLK1 and string chunks SC in the above example) in each memory chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory including a first memory chip and a second memory chip; and
a controller configured to write data to the memory,
wherein each of the first and second memory chips includes
string units, wherein memory cell transistors are connected in series in the string units; and
blocks including the string units,
wherein in writing of the data, the controller transmits, to the memory,
a write command,
a first block address corresponding to the first memory chip, the first memory chip including a bad string unit,
a second block address corresponding to the second memory chip,
first data corresponding to the first block address, and
second data corresponding to the second block address, and
wherein the first block address is a physical address which is not allocated to any of the blocks included in the first memory chip.

2. The system according to claim 1, wherein the memory writes the second data to a block designated by the second block address without writing the first data to the first block address.

3. The system according to claim 1, wherein, in erasing of the data, the controller transmits, to the memory,
an erase command,
the first and second block addresses, and
information indicating whether or not there is a bad string unit in each of blocks designated based on the first and second block addresses, and a position of the bad string unit.

4. The system according to claim 3, wherein the memory erase-verifies a good string unit based on the information without erase-verifying the bad string unit.

5. The system according to claim 1, wherein the controller reads information of a bad string unit by issuing a first read command.

6. The system according to claim 1, wherein the controller is capable of arbitrarily setting a combination of the first and second block addresses.

7. The system according to claim 1, wherein, in writing of the data,
the controller further transmits first and second string unit addresses designating string units in each of blocks designated based on the first and second block addresses to the memory, and
the controller is capable of arbitrarily setting a combination of the first and second string unit addresses.

8. The system according to claim 1, wherein
the first and second memory chips respectively include first and second memory cell arrays capable of independently operating,
each of the first and second memory cell arrays includes the string units, and
in writing of the data, the controller transmits, to the memory,
the write command,
the first block address corresponding to one of the blocks in the first memory cell array of the first memory chip,
a third block address corresponding to one of the blocks in the second memory cell array of the first memory chip,
the second block address corresponding to one of the blocks in the first memory cell array of the second memory chip,
a fourth block address corresponding to one of the blocks in the second memory cell array of the second memory chip,
the first and second data corresponding to the first and second block addresses, and
third and fourth data corresponding to the third and fourth block addresses.

9. A memory system comprising:
a nonvolatile memory including a first memory chip and a second memory chip, each of the first memory chip and the second memory chip including a plurality of blocks, each of the plurality of blocks including:
a plurality of string units, each of the plurality of string units including a serial connection of a select transistor, a first memory cell, and a second memory cell;
a bit line electrically connected to the string units, in common;
a plurality of select gate lines, each of the plurality of select gate lines being electrically connected to a gate of the select transistor of each of the plurality of string units;
a first word line electrically connected to gates of first memory cells of the string units, in common; and
a second word line electrically connected to gates of second memory cells of the string units, in common, and
a controller configured to control the nonvolatile memory, collectively read data from memory cells including the first memory cell included in one of the plurality of string units, the memory cells being included in the one of the plurality of string units, the memory cells being connected to the first word line, manage a partial bad block which includes a bad string unit and a good string unit, and manage which one of the plurality of string units is the bad string unit in the partial bad block,
wherein information of an address indicating which one of the blocks is the partial bad block and information of a bad string unit indicating which one of the string units in the partial bad block is the bad string unit are managed as a table.

10. The system according to claim 9, wherein the controller is configured to recognize the partial bad block which includes the bad string unit using the information in the table.

11. The system according to claim 10, wherein the controller groups a first block among the plurality of the blocks included in the first memory chip and a second block among the plurality of the blocks included in the second memory chip based on the information in the table.

12. The system according to claim 11, wherein the same logical block address is allocated to the grouped first block and second block.

13. The system according to claim 10, wherein the controller accesses one of the string units except the bad string unit based on the information in the table when receiving a write command from a host apparatus.

14. The system according to claim 11, wherein the controller
reads the information from the nonvolatile memory, and
decides that a string unit is the bad string unit and updates the information in the table according to a state of the string unit when a number of error bits of data read from the string unit exceeds a threshold.

15. The system according to claim 14, wherein the controller updates a set of blocks to be grouped based on the updated information in the table.

16. The system according to claim 11, wherein
the controller groups a first string unit and a second string unit,
the first string unit is one of the string units in the first block,
the second string unit is one of the string units in the second block, and
the first block and the second block belong to the same group.

17. The system according to claim 16, wherein the controller is capable of accessing the grouped first string unit and the second string unit in parallel.

18. The system according to claim 9, wherein
the first memory chip includes a first memory cell array and a second memory cell array capable of operating independently from each other,
the first memory cell array includes a first block which is a first one of the plurality of blocks,
the second memory cell array includes a second block which is a second one of the plurality of blocks,
the first block includes a first string unit which is a first one of the plurality of string units in the first block,
the second block includes a second string unit which is a second one of the plurality of string units in the second block,
the controller is capable of accessing the first string unit and the second string unit in parallel, and
when the first string unit is bad, the controller decides that the second string unit is bad.

19. The system according to claim 18, wherein
the second memory chip includes a third memory cell array and a fourth memory cell allay capable of operating independently from each other, the third memory cell array includes a third block which is a third one of the plurality of blocks, the fourth memory cell array includes a fourth block which is a fourth one of the plurality of blocks, and the controller is capable of accessing the first block, the second block, the third block, and the fourth block in parallel.

20. The system according to claim 18, wherein the memory holds the information in units of blocks capable of operating in parallel in the first memory cell array and the second memory cell array.

* * * * *